United States Patent
Gates et al.

(10) Patent No.: US 12,178,142 B2
(45) Date of Patent: Dec. 24, 2024

(54) LAYERED SUBSTRATE STRUCTURES WITH ALIGNED OPTICAL ACCESS TO ELECTRICAL DEVICES

(71) Applicant: International Business Machines Corporation, Armonk, NY (US)

(72) Inventors: Stephen M. Gates, Ossining, NY (US); Russell A. Budd, North Salem, NY (US); Kevin Shawn Petrarca, Newburgh, NY (US); Vivekananda P. Adiga, Ossining, NY (US); Douglas Max Gill, South Orange, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 170 days.

(21) Appl. No.: 17/097,252

(22) Filed: Nov. 13, 2020

(65) Prior Publication Data

US 2022/0158068 A1  May 19, 2022

(51) Int. Cl.
  *H10N 60/80* (2023.01)
  *H10N 60/01* (2023.01)
  (Continued)

(52) U.S. Cl.
  CPC ....... *H10N 60/805* (2023.02); *H10N 60/0912* (2023.02); *H10N 60/12* (2023.02); *H10N 60/81* (2023.02); *H10N 60/815* (2023.02)

(58) Field of Classification Search
  CPC . H01L 27/14618; H01L 39/025; H01L 39/04; H01L 39/045; H01L 39/223;
  (Continued)

(56) References Cited

U.S. PATENT DOCUMENTS

| 5,502,292 A | 3/1996 | Pernicka et al. |
| 6,900,456 B2 | 5/2005 | Blais et al. |

(Continued)

FOREIGN PATENT DOCUMENTS

WO   2018063168   4/2018

OTHER PUBLICATIONS

Chen et al., "Fabrication and Characterization of Aluminum Airbridges for Superconducting Microwave Circuits," arXiv:1310.2325 [cond-mat.mes-hall], Oct. 10, 2013, 8 pages.

(Continued)

*Primary Examiner* — Aaron J Gray
(74) *Attorney, Agent, or Firm* — Amin, Turocy & Watson, LLP

(57) ABSTRACT

The subject disclosure is directed towards layered substrate structures with aligned optical access to electrical devices formed thereon for laser processing and electrical device tuning. According to an embodiment, a layered substrate structure is provided that comprises an optical substrate having a first surface and a second surface and a patterned bonding layer formed on the second surface that comprises a bonding region and an open region, wherein the open region exposes a portion of the second surface. The layered substrate structure further comprises a device chip bonded to the patterned bonding layer via the bonding region and comprising at least one electrical component aligned with the optical substrate and the open region. The at least one electrical component can include for example, a thin film wire, an air bridge, a qubit, an electrode, a capacitor or a resonator.

12 Claims, 13 Drawing Sheets

(51) Int. Cl.
*H10N 60/12* (2023.01)
*H10N 60/81* (2023.01)

(58) Field of Classification Search
CPC .............. H01L 39/2493; H10N 60/805; H10N 60/0912; H10N 60/12; H10N 69/00; H10N 60/81; H10N 60/815
See application file for complete search history.

(56) References Cited

U.S. PATENT DOCUMENTS

| | | | |
|---|---|---|---|
| 7,736,949 | B2 | 6/2010 | Chen et al. |
| 8,491,983 | B2 | 7/2013 | Ono et al. |
| 9,236,328 | B1 | 1/2016 | Leobandung |
| 9,350,460 | B2 | 5/2016 | Paik |
| 9,971,970 | B1* | 5/2018 | Rigetti ................... H10N 69/00 |
| 10,056,540 | B2 | 8/2018 | Abraham et al. |
| 10,169,714 | B2 | 1/2019 | Chow et al. |
| 10,170,680 | B2 | 1/2019 | Abraham et al. |
| 10,170,681 | B1 | 1/2019 | Rosenblatt et al. |
| 10,177,297 | B2 | 1/2019 | Marcus et al. |
| 10,340,438 | B2 | 7/2019 | Rosenblatt et al. |
| 10,418,540 | B2 | 9/2019 | Orcutt et al. |
| 2007/0166029 | A1 | 7/2007 | Lee et al. |
| 2011/0080516 | A1 | 4/2011 | Yi et al. |
| 2013/0256849 | A1* | 10/2013 | Danny ................... H01P 5/107 257/664 |
| 2014/0029894 | A1 | 1/2014 | Bowen |
| 2014/0264286 | A1 | 9/2014 | Chang et al. |
| 2014/0264287 | A1* | 9/2014 | Abraham ................ H01P 7/086 257/31 |
| 2017/0033273 | A1 | 2/2017 | Chang et al. |
| 2017/0072504 | A1 | 3/2017 | Abraham et al. |
| 2017/0077382 | A1 | 3/2017 | Abraham et al. |
| 2019/0165244 | A1 | 5/2019 | Hertzberg et al. |
| 2019/0207075 | A1* | 7/2019 | Megrant ................. F17C 3/085 |
| 2019/0385673 | A1 | 12/2019 | Bosman et al. |
| 2020/0052182 | A1 | 2/2020 | Brink et al. |
| 2020/0075834 | A1 | 3/2020 | Topaloglu et al. |
| 2021/0183915 | A1* | 6/2021 | Summerfelt ...... H01L 27/14627 |

OTHER PUBLICATIONS

Domke et al., "Ultra-fast movies of thin-film laser ablation," Applied Physics A, Jul. 31, 2012, 13 pages.

Heise et al., "Laser lift-off initiated by direct induced ablation of different metal thin films with ultra-short laser pulses," Journal of Physics D Applied Physics, vol. 45, Issue 31, Jul. 17, 2012, 9 pages.

Schrider, "Femtosecond Laser Interaction with Ultrathin Metal Films: Modifying Structure, Composition, and Morphology," A dissertation submitted in partial fulfillment of the requirements for the degree of Doctor of Philosophy (Materials Science and Engineering), University of Michigan, 2017, 189 pages.

Miller et al., "Diffusion of Aluminum in Single Crystal Silicon," Journal of Applied Physics, vol. 27, Issue 12, Dec. 1956, 4 pages.

Polignano et al., "Niobium Contamination in Silicon," ECS Transactions, Jan. 2010, 13 pages.

Afonin et al., "Niobium, Indium, and Tin Heterodiffusion during Formation of Two-Layer Systems on Silicon Single Crystals," Russian Journal of Inorganic Chemistry, May 2011, 6 pages.

Araki et al., "Thermal Diffusivity Measurements of Refractory Metals as Candidate Reference Materials by the Laser Flash Method," International Journal of Thermophysics, vol. 26, No. 6, Nov. 2005, 9 pages.

Gorbatov et al., "Thermal Diffusivity of Submicro- and Nanocrystalline Niobium, Titanium, and Zirconium at High Temperatures," High Temperature, vol. 51, No. 4, 2013, 4 pages.

"Thermal Conductivity of Metals, Metallic Elements and Alloys," The Engineering ToolBox, www.EngineeringToolBox.com, last accessed on Aug. 20, 2020, 7 pages.

"Supplier Data—Sapphire Single Crystal (Alumina 99.9%)—(Goodfellow)," AZO Materials, www.azom.com, last accessed on Aug. 20, 2020.

"Niobium," https://periodictable.com/Elements/041/, last accessed on Aug. 20, 2020, 24 pages.

"Thermal diffusivity," Wikipedia, https://en.wikipedia.org/wiki/Thermal_diffusivity, last accessed on Aug. 20, 2020, 6 pages.

"LASERtrim® RF Tuning Capacitors," Johanson Technology, https://www.johansontechnology.com/lasertrim-rf-tuning, last accessed on Aug. 20, 2020, 2 pages.

"Design and Testing of Capacitors for Uninterruptable Power Supplies," http://www.cde.com/resources/downloads/Segmented-Film-Capacitor-Paper-6-5-2018.pdf, 12 pages.

Matthias et al., "The Influence of Thermal Diffusion on Laser Ablation of Metal Films," Applied Physics A, 1994, 8 pages.

Lankwarden et al., "Development of NbTiN—Al Direct Antenna Coupled Kinetic Inductance Detectors," J Low Temp Phys, 2012, 6 pages.

Jin et al., "Fabrication of Al air-bridge on coplanar waveguide," Chinese Physics B, vol. 27, No. 10, 6 pages.

Krause et al., "Layer-selective lift-off processing in a TCO/Si thin film system by ultra-short (ps, fs) laser pulses," IEEE 43rd Photovoltaic Specialists Conference (PVSC), 2016, 5 pages.

"Simple Parallel (Tank Circuit) Resonance," All About Circuits, vol. II—Alternating Current (AC), Chapter 6—Resonance, https://www.allaboutcircuits.com/textbook/alternating-current/chpt-6/parallel-tank-circuit-resonance/, last accessed on Aug. 20, 2020, 8 pages.

List of IBM Patents or Applications Treated as Related.

International Search Report and Written Opinion received for PCT Application Serial No. PCT/EP2021/080890 dated May 6, 2022, 13 pages.

* cited by examiner

LAYERED SUBSTRATE STRUCTURES WITH ALIGNED OPTICAL ACCESS TO ELECTRICAL DEVICES

TECHNICAL FIELD

This disclosure relates to layered substrate structures with aligned optical access to electrical devices formed thereon for laser processing and electrical device tuning.

BACKGROUND

In large multi-qubit systems, a qubit's resonant frequency must be precisely controlled to avoid signaling collisions. Due to semiconductor processing variabilities, a qubit's original resonant frequency as fabricated typically deviates from design targets. Recent qubit packaging schemes envision bonding the qubit substrate to a handler wafer via an adhesive layer for additional processing and substrate thinning Typically, a blanket metal ground plane covers the qubit substrate surface opposite the qubits to isolate the qubit's electrodes from the wafer and the adhesive layer. This continuous metal ground plane and adhesive layer block access to the qubit's electrodes for laser processing and qubit tuning.

SUMMARY

The following presents a summary to provide a basic understanding of one or more embodiments of the invention. This summary is not intended to identify key or critical elements or delineate any scope of the different embodiments or any scope of the claims. Its sole purpose is to present concepts in a simplified form as a prelude to the more detailed description that is presented later. The subject disclosure is directed towards layered substrate structures with aligned optical access to electrical devices formed thereon for laser processing and electrical device tuning.

According to an embodiment, a layered substrate structure is provided that comprises an optical substrate having a first surface and a second surface and a patterned bonding layer formed on the second surface that comprises a bonding region and an open region, wherein the open region exposes a portion of the second surface. The layered substrate structure further comprises a device chip bonded to the patterned bonding layer via the bonding region and comprising at least one electrical component aligned with the optical substrate and the open region. In various embodiments, the at least one electrical component can include but is not limited to: a thin film metal structure, a thin film metal structure formed of a superconducting metal, a thin film wire, an air bridge, a qubit, an electrode, a capacitor or a resonator.

In one or more embodiments, the device chip can be or include a semiconductor chip with a thickness between about 50 micrometers ($\mu m$) and about 500 $\mu m$. The patterned bonding layer of the layered substrate structure can comprise a bonding material selected from a group consisting of: polyimide polymer, indium, indium nitride, gold, gold nitride, platinum, platinum nitride, titanium, titanium nitride, tantalum, tantalum nitride, chromium, chromium nitride, tungsten, tungsten nitride, silver, silver nitride, copper, aluminum, aluminum oxide and tin.

The layered substrate structure further comprises one or more enclosed cavities formed between the optical substrate and the device chip within the open region. In some implementations, the one or more cavities comprise an inert gas and/or were formed under a vacuum such that the one or more cavities are devoid of oxygen and water.

In some implementations, the device chip comprises a bonded surface via which the device chip is bonded to the patterned bonding layer and a front surface opposite the bonded surface, and the at least one electrical component is formed on the front surface. Additionally, or alternatively, the at least one electrical component can be formed on the bonded surface. In either of these implementations, the layered substrate structure can further comprise a patterned metal layer formed on the bonded surface that comprises one or more openings aligned with the open region. In various implementations, the patterned metal layer comprises a superconducting metal material. The layered substrate structure can further comprise one or more alignment marks formed on the device chip at one or more defined locations that facilitate aligning the at least one electrical component with the open region and the one or more openings.

The layered substrate structure further comprises an optical path through the optical substrate and the open region that provides for at least 50% light transmission to the at least one electrical component at a wavelength of about 1.5 micrometers ($\mu m$). The optical substrate can comprise a material selected from the group consisting of sapphire, quartz, and doped silicon with a doping concentration less than about $1E14$ $cm^{-3}$. In some implementations, the optical substrate comprises an antireflective coating formed on the first surface and the second surface.

Additional embodiments are directed to a method for forming a layered substrate structure with aligned optical access to electrical devices formed thereon for laser processing and electrical device tuning. In one or more embodiments, the method comprises forming one or more alignment marks within a device wafer from a first surface of the device wafer, forming a ground plane layer on the first surface, and forming one or more first openings within the ground plane layer at one or more defined positions relative to the one or more alignment marks. The method further comprises, forming one or more second openings within a bonding layer, bonding an optical substrate to the ground plane layer of the device wafer via the bonding layer with the one or more first openings aligned with the one or more second openings, and thinning a second surface of the device wafer opposite the first surface to expose the one or more alignment marks, resulting in formation of a layered substrate structure.

In some embodiments, forming the one or more second openings comprises patterning the bonding layer as formed on a surface of the optical substrate. Additionally, or alternatively, forming the one or more second openings comprises depositing the bonding layer on one or more portions of the ground plane layer excluding the one or more first openings.

The method can further comprise forming one or more electrical components on the second surface of the device wafer at the one or more defined positions using the alignment marks, resulting in the one or more electrical components being aligned with the one or more first openings and the one or more second openings. In some implementations, the method can further comprise forming one or more enclosed cavities between the device wafer and the optical substrate at the one or more second openings as a result of the bonding, and wherein the bonding comprises bonding the optical substrate to the device wafer under a vacuum or inert environment, resulting in removal of oxygen and water from the one or more enclosed cavities.

The disclosed subject matter further provides a method for tuning an electrical device formed on a layered substrate structure. In one embodiment, the method comprises forming a layered substrate structure comprising: an optical substrate having a first surface and a second surface, a patterned bonding layer formed on the second surface and comprising a bonding region and an open region, the open region exposing a portion of the second surface, and a device chip bonded to the patterned bonding layer via the bonding region and comprising at least one electrical component aligned with the optical substrate and the open region.

The method further comprises contacting a laser beam with the at least one electrical component through the optical substrate and the open region and modifying a state or property of the at least one electrical component as a result of the contacting. In various embodiments, the at least one electrical component can include but is not limited to: a thin film metal structure, a thin film metal structure formed of a superconducting metal, a thin film wire, an air bridge, a qubit, an electrode, a capacitor or a resonator.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Figure 1:
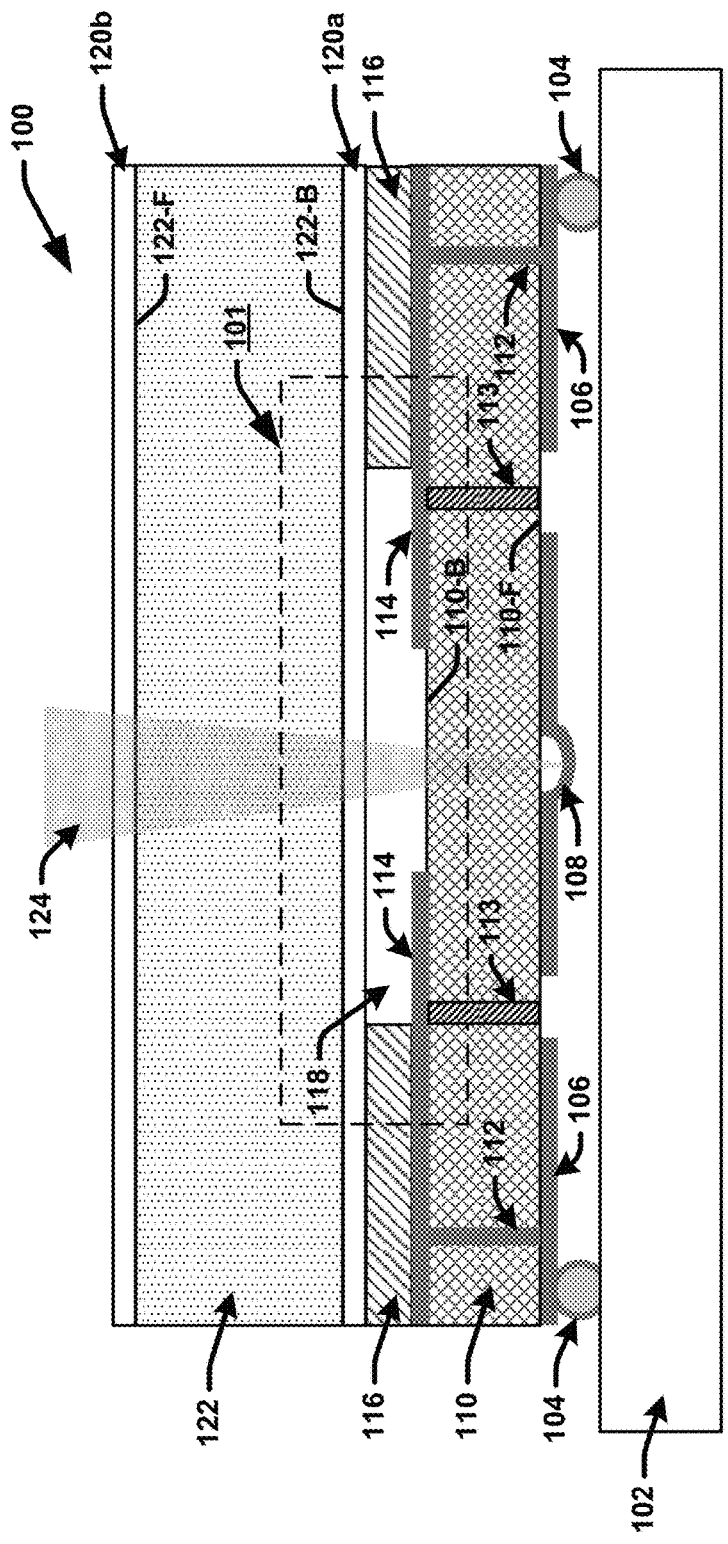
FIG. 1 presents a cross-sectional view of a layered substrate structure with aligned optical access to an electrical device formed thereon in accordance with embodiments described herein.
Figure 1:
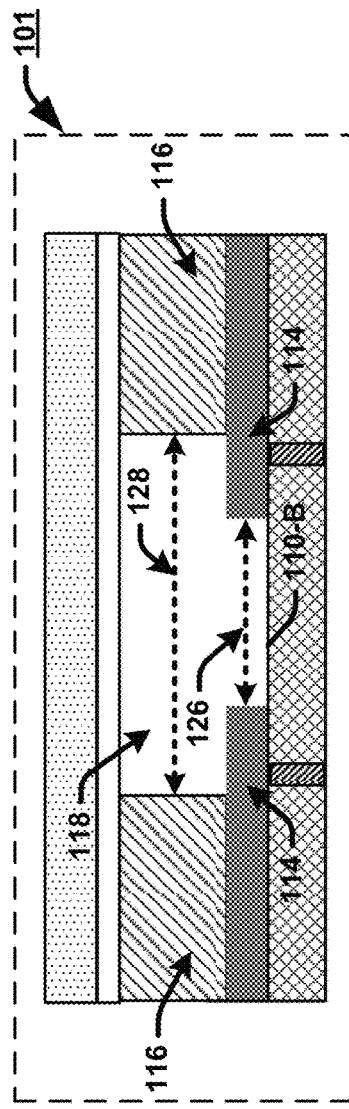

The following detailed description is merely illustrative and is not intended to limit embodiments and/or application or uses of embodiments. Furthermore, there is no intention to be bound by any expressed or implied information presented in the preceding Summary section or in the Detailed Description section.

One or more embodiments are now described with reference to the drawings, wherein like referenced numerals are used to refer to like elements throughout. It should be appreciated that the various structures depicted in the drawings (e.g., the different layers, substrates, wafers, electrical components, etc.) are merely exemplary and are not drawn to scale. In the following description, for purposes of explanation, numerous specific details are set forth in order to provide a more thorough understanding of the one or more embodiments. It is evident, however, in various cases, that the one or more embodiments can be practiced without these specific details. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, unless otherwise specified, terms such as on, overlying, atop, on top, positioned on, or positioned atop mean that a first element is present on a second element, wherein intervening elements may be present between the first element and the second element. As used herein, unless otherwise specified, the term directly used in connection with the terms on, overlying, atop, on top, positioned, positioned atop, contacting, directly contacting, or the term direct contact, mean that a first element and a second element are connected without any intervening elements between them. As used herein, terms such as upper, lower, above, below, directly above, directly below, aligned with, adjacent to, right, left, vertical, horizontal, top, bottom, and derivatives thereof shall relate to the disclosed structures as oriented in the drawing figures. The term "aligned with" is used herein to refer to an element being positioned directly along a same line vertical or horizontal line relative to one another element. For example, the term aligned with as used herein can refer to a first element being directly above or below a second element.

The terms "substrate," "wafer" and "chip" are used herein interchangeably unless context warrants particular distinction amongst the terms. The term "device chip," is herein to refer to a chip, substrate, or wafer that corresponds to or includes an electrical component or device. The terms "electrical device," "electrical component," "electrical element," "electrical structure," and the like are used herein interchangeably unless context warrants particular distinction amongst the terms.

Herein, the term "bonded" means that two structures (e.g., wafers, chips, substrates, etc.) are joined in fixed adhesive contact to enable handling the joined structures using processing tools, cutting of the joined structures, thinning/grinding of at least one of the structures, and the like. Thinning is known in the art to include for example grinding and chemical mechanical polish steps.

FIG. 1 presents a cross-sectional view of a layered substrate structure 100 with aligned optical access to an electrical device formed thereon in accordance with embodiments described herein.

Layered substrate structure 100 includes a device chip 110 with a front surface 110-F and a back surface 110-B (also referred to as the bonding surface). Layered substrate structure 100 further includes an optical substrate 122 (also referred to as a handler) bonded to the back surface 110-B of the device chip 110 via a patterned bonding layer 116. In the embodiment shown, the device chip 110 is further bonded to or otherwise attached to a silicon interposer 102 via one or more solder bonds 104.

The device chip 110 can include one or more electrical device or electrical components formed thereon and/or therein. In various embodiments, the layered substrate structure 100 can be or correspond to a qubit package or structure and the device chip 110 can be or correspond to a qubit chip. With these embodiments, the one or more electrical components can include one or more qubits or qubit electrodes. However, layered substrate structure 100 and other layered substrate structures described herein are not limited to qubit structures.

In the embodiment shown, the device chip 110 includes electrical components formed on the back surface 110-B, including electrical components 106 and electrical component 108. The type of the electrical components 106 and/or the type of electrical component 108 can vary. For example, the electrical components 106 and/or the electrical component 108 can include, but are not limited to: a thin film metal structure, a thin film metal structure formed with a superconducting metal, a thin film wire, an air bridge, a qubit, an electrode, a capacitor and/or a resonator. In the embodiment shown, electrical component 108 corresponds to an air bridge and electrical components 106 correspond to thin film metal structures. The number of the electrical components formed on the back surface 110-B of the device chip 110 can also vary.

The material and thickness of the device chip 110 can also vary. In some embodiments, the device chip 110 can be formed with silicon. Other suitable materials for the device chip 110 can include but are not limited to: sapphire, quartz, silicon carbide or other compound semiconductors. In various embodiments, the thickness of the device chip 110 can range from between about 50 µm to about 800 µm. In some implementations, the thickness of the device chip 110 is preferably between about 50 µm and about 300 µm, and more preferably between about 50 µm and about 200 µm. In one exemplary embodiment, the thickness of the device chip 110 is about 100 µm.

The device chip 110 further includes a patterned metal layer 114 formed on the back surface 110-B of the device chip 110. For example, in the embodiment shown, the patterned metal layer 114 comprises an open region or opening that exposes a portion of the back surface 110-B of the device chip 110. An extracted view of a central region of the layered substrate structure 100 in dashed box 101 is shown in the bottom left corner of FIG. 1 to provide a better view of the opening in the patterned metal layer 114. As shown in the extracted view of dashed box 101, open regions or openings in the patterned metal layer 114 are referred to herein as first openings 126. In the embodiment shown, the patterned metal layer 114 comprises a single first opening 126. However, the number of first openings 126 in the patterned metal layer can vary. For example, in some embodiments as described in greater detail infra with reference to FIGS. 2-4, the patterned metal layer 114 can comprise a plurality of first openings 126 (or open regions).

In various embodiments, the patterned metal layer 114 can be or correspond to a patterned ground plane layer. In this regard, the patterned metal layer 114 can also be referred to herein as a patterned ground plane layer. The material of the patterned metal layer 114 can vary. In some embodiments, the patterned metal layer 114 comprise a superconducting metal. For example, the superconducting metal can include but is not limited to: aluminum, niobium, and alloys of niobium with titanium or another metal. Other suitable materials for the patterned metal layer 114 can include but are not limited to: nitrides such as niobium nitride, titanium nitride, and niobium having a barrier layer on the top surface, where the barrier can include the metal nitrides just mentioned.

The device chip 110 can further include one or more thru-silicon-vias (TSVs) formed through the device chip 110 from the front surface 110-F to the back surface 110-B. For example, in the embodiment shown, the device chip 110 includes two TSVs 112. However, it should be appreciated that the number of TSVs 112 can vary. The TSVs respectively electrically connect the patterned metal layer 114 on the back surface 110-B of the chip to the electrical components 106 formed on the front surface 110-F of the device chip. In this regard, the TSVs 112 respectively reach through the front surface 110-F of the device chip 110 and make electrical contact to the patterned metal layer 114 and reach through the back surface 110-B of the device chip and make electrical contact to the electrical components 106. The TSVs 112 can provide for grounding the device chip 110 as well as used to facilitate alignment of at least one electrical component on the device chip 110 with the first opening 126 in the patterned metal layer, as discussed in greater detail infra. The TSVs 112 can be formed within and through the device chip 110 using standard TSV processing techniques. For example, the TSVs 112 can be patterned via lithography using front-end-of-line processing (FEOL) and/or back-end-of-line processing (BEOL).

The optical substrate 122 can comprise a transparent or semi-transparent material that provides for transmission of light (e.g., laser beam 124) therethrough as emitted by a laser (not shown) at a desired wavelength. For example, in some embodiments, the optical substrate 122 can comprise a material that has an optical transmission of between about 50% to about 90% light transmission at a wavelength between about 0.5 µm to about 3.0 µm. In another embodiment, the optical substrate 122 can comprise a material that has an optical transmission property of between about 50% to about 90% light transmission at a wavelength between about 1.0 µm to about 2.0 µm. In yet another embodiment, the optical substrate 122 can comprise a material that has optical transmission property of between about 50% to about 90% light transmission at a wavelength between 1.0 and 2.0 µm, for example the wavelength of about 1.5 µm. Silicon is one material that meets these requirements and may be used to form the optical substrate 122.

It should be appreciated that the degree of optical transmission of the optical substrate 122 and the desired wavelength can vary depending on the type of material used for the optical substrate and the thickness of the optical substrate 122. In some embodiments, the optical substrate 122 can be formed with a crystalline material, such as (but not limited to) sapphire and/or quartz. In another embodiment, the optical substrate 122 can be formed with lightly doped silicon, such as silicon with a doping concentration of about $1E15$ cm$^{-3}$ (dopant atoms per cubic centimeter) or less and more preferably about $1E12$ cm$^{-3}$ or less. In some embodiments, the thickness of the optical substrate 122 can range from between about 100 µm to about 1500 µm. In another example embodiment, the thickness of the optical substrate 122 can range from between about 200 µm to about 1000 µm. In another example embodiment, the thickness of the optical substrate 122 can range from between about 400 µm to about 900 µm. In yet another embodiment, the thickness of the optical substrate 122 can be about 725 µm.

The optical substrate 122 can further include an antireflective coating formed on the front surface 122-F and/or the back surface 122-B of the optical substrate. For example, in the embodiment shown, the optical substrate 122 comprises a first antireflective coating 120a formed on the back surface 122-B of the optical substrate 122 and a second antireflective coating 122b formed on the front surface 122-F of the optical substrate. The material used for the antireflective coating formed on both surfaces of the optical substrate 122 can be the same. In some embodiments, the antireflective coating (e.g., including the first antireflective coating 120a and the second antireflective coating 120b) can include silicon nitride (SiN), such as $Si_3N_4$. The antireflective coating has a refractive index (RI) that is different from that of the optical substrate 122. Other suitable materials for the antireflective coating (e.g., including the first antireflective coating 120a and the second antireflective coating 120b) can include but are not limited to: various other forms of SiN denoted $Si_xN_y$, (wherein x and y can include any number), silicon oxide ($SiO_2$), aluminum oxide ($Al_2O_3$), aluminum nitride (AlN), titanium nitride (TiN), and magnesium fluoride ($MgF_2$).

The thickness of the first antireflective coating 120a and the second antireflective coating 120b can vary. In some embodiments, the respective thicknesses of the first antireflective coating 120a and the second antireflective coating 120b can be between about 50 nanometers (nm) and about 500 nm. In another example embodiment, the respective thicknesses of the first antireflective coating 120a and the second antireflective coating 120b can be between about 100 nm and about 250 nm. In another example embodiment, the respective thicknesses of the first antireflective coating 120a and the second antireflective coating 120b can be between about 150 nm and about 200 nm. In one example, implementation, the respective thicknesses of the first antireflective coating 120a and the second antireflective coating 120b can be about 187 nm.

The layered substrate structure 100 further includes a patterned bonding layer 116 formed between the back surface 110-B of the device chip 110 and the back surface 122-B of the optical substrate 122 that bonds the device chip 110 to the optical substrate 122. The patterned bonding layer 116 can include one or more open regions or openings that expose the back surface 122-B of the optical substrate 122, (or more particularly the first antireflective coating formed on the back surface 122-B), and one or more bonding regions. With reference to the extracted view in dashed box 101, open regions or openings in the patterned bonding layer 116 are referred to herein as second openings 128. In the embodiment shown, the patterned bonding layer 116 comprises a single second opening 128. However, the number of second openings 128 in the patterned bonding layer can vary. For example, in some embodiments as described in greater detail infra with reference to FIGS. 2-4, the patterned bonding layer 116 can comprise a plurality of second openings 128 (or open regions) and a plurality of bonding regions.

The patterned bonding layer 116 can be formed on the back surface 110-B of the device chip 110 and/or the back surface 122-B of the optical substrate 122 such that the second opening 128 is aligned with the first opening 126. More particularly, the bonding portions of the patterned bonding layer 116 can be formed on and/or bonded to the metal portions of the patterned metal layer 114 on the back surface 110-B of the device chip 110 excluding the first opening 126.

The material used for the patterned bonding layer 116 can vary. In some embodiments, the patterned bonding layer 116 can be formed with an adhesive material. For example, the adhesive material can include a polyimide polymer or another adhesive material capable of being patterned (e.g., thermoplastic polyimide adhesives). Other adhesives are available as known to one skilled in the art. In other embodiments, the patterned bonding layer 116 can comprise a metal bonding layer and the device chip 110 can be bonded to the optical substrate 122 via a metal-to-metal bond. For example, in some implementations, the patterned metal layer 114 can formed on the back-surface of the optical substrate 122-B (or more particularly the first antireflective coating 120a) with the metal bonding portions being located at defined positions relative to the metal portions of the patterned metal layer 114. The metal bonding portions of the patterned bonding layer 116 can further be solder bonded or thermal compression bonded to the metal portions of the patterned metal layer 114 via a metal-to-metal bond. With these embodiments, the patterned bonding layer 116 can comprise one or more metals or metal layers, including but not limited to: indium, indium nitride, gold, gold nitride, platinum, platinum nitride, titanium, titanium nitride, tantalum, tantalum nitride, chromium, chromium nitride, tungsten, tungsten nitride, silver, silver nitride, copper, aluminum, aluminum oxide and/or tin.

The layered substrate structure 100 further includes an enclosed cavity 118 formed between the optical substrate 122 and the device chip 110 as a result of the first opening 126 in the patterned metal layer 114 and the second opening 128 in the patterned bonding layer 116. In this regard, the enclosed cavity 118 includes the first opening 126 in the patterned metal layer 114 and the second opening 128 in the patterned bonding layer 116. In some embodiments, the device chip 110 can be bonded to the optical substrate 122 in an inert environment (e.g., in an inert gas environment such as nitrogen, argon and/or other inert gases) and/or under vacuum, resulting in the enclosed cavity 118 being devoid of and or having a very low concentration of oxygen and/or water. As a result, any metal components and structures exposed within the cavity will be prevented from oxidation and/or corrosion. In embodiments, in which the device chip 110 was bonded to the optical substrate 122 in an inert environment, the enclosed cavity 118 can comprise an inert gas such as nitrogen, argon, or another inert gas.

The dimensions of the first opening 126 in the patterned metal layer 114, the second opening 128 in the patterned bonding layer 116, and the enclosed cavity 118 can vary. For example, in some embodiments, the first opening 126 and/or the second opening 128 can have a diameter (or edge to edge length for non-circular openings) between about 10 um to about 2000 µm. In another embodiment, the first opening 126 and/or the second opening 128 can have a diameter (or edge to edge length for non-circular openings) between about 10 µm to about 1000 µm. In another embodiment, the first opening 126 and/or the second opening 128 can have a diameter (or edge to edge length for non-circular openings) between about 10 µm to about 800 µm. In another embodiment the first opening 126 and/or the second opening 128 can have a diameter between about 10 µm to about 500 µm. In another embodiment, the first opening 126 and/or the second opening 128 can have a diameter between about 10 µm to about 100 µm. In various embodiments, the first opening 126 can be smaller than the second opening 128.

The shape or geometry of the first opening 126 and the second opening 128 can vary. For example, the respective openings can be circular, square, rectangular and/or various other shapes.

The design of the layered substrate structure 100 shown in FIG. 1 provides a direct optical path from the front surface 122-F of optical substrate 122 through the optical substrate 122, the enclosed cavity 118 and the device chip 110 to electrical component 108 formed on the front surface 110-F of the device chip 110. In the embodiment shown, a laser beam 124 is shown being transmitted through this optical path and reaching the electrical component 108. In this regard, design of the layered substrate structure 100 aligns the electrical component 108 with the first opening 126 in the patterned metal layer 114 and the second opening 128 in the patterned bonding layer 116, resulting in the electrical component 108 being in-line of sight of the laser beam 124 as transmitted through the optical substrate 122 and the device chip 110. As a result, the design of the layered substrate structure 100 provides for optically accessing or contacting the laser beam 124 with the electrical component 108 through the optical substrate 122, the second opening 128 and the first opening 126, and the device chip 110 to modify a state or property of the electrical component 108. For example, in the embodiment shown, the electrical component 108 corresponds to an air-bridge. With this example embodiment, the laser beam 124 can be used to open and/or close the air-bridge via the direct optical path to the electrical component 108 through the optical substrate 122, the second opening 128, the first opening 126 and the device chip 110. In another example, in which the electrical component 108 comprises a qubit, the laser beam 124 can be used to change the resonant frequency of the qubit.

The device chip 110 can further include one or more alignment marks 113 to facilitate aligning the electrical component 108 with the first opening 126 in the patterned metal layer 114 and the second opening 128 in the patterned bonding layer 116 during fabrication of the layered substrate structure 100. Additionally, or alternatively, the TSVs 112 can be used as the alignment marks during 116 during fabrication of the layered substrate structure 100. In some embodiments, the alignment marks 113 can also comprise metal TSVs formed through the device chip 110 from the front surface 110-F of the device chip to the back surface 110-B of the device chip. In some embodiments, the alignment marks 113 and/or the TSVs 112 formed through the device chip 110 can be circular or rectangular in shape or can have various shapes used for lithographic alignment, including squares, plus signs, rectangles, boxes, and parallel lines.

In this regard, the alignment marks 113 (and/or the TSVs 112) can be formed at defined or known positions through the device chip 110 and exposed on both the front surface 110-F and the back surface 110-B of the device chip 110 during fabrication of the layered substrate structure 100. The first opening 126 in the patterned metal layer 114 and the second opening 128 in the patterned bonding layer 116 can further be formed at defined or known positions relative to the alignment marks 113 (and/or the TSVs 112) on the back surface 110-B of the device chip during fabrication. As a result, the position of the first opening 126 in the patterned metal layer 114 and the second opening 128 in the patterned bonding layer 116 relative to the alignment marks 113 (and/or the TSVs 112) exposed on the front surface 110-F of the device chip will be known. For example, in accordance with layered substrate structure 100, the position of the first opening 126 and the second opening 128 will be known to be directly between the alignment marks 113 (and/or the TSVs 112) and/or a defined distance from the respective alignment marks 113 (and/or the TSVs 112). Accordingly, using the exposed alignment marks 113 (and/or the TSVs 112) on the front surface 110-F of the device chip 110 as guide, the electrical component 108 can be placed/formed on the front surface 110-F of the device chip 110 directly between the alignment marks to ensure that it is positioned in alignment with the first opening 126 and the second opening 128. Additional details regarding the fabrication of layered substrate structure 100 are provided infra with reference to FIGS. 5A-J and 6A-C.

Figure 2:
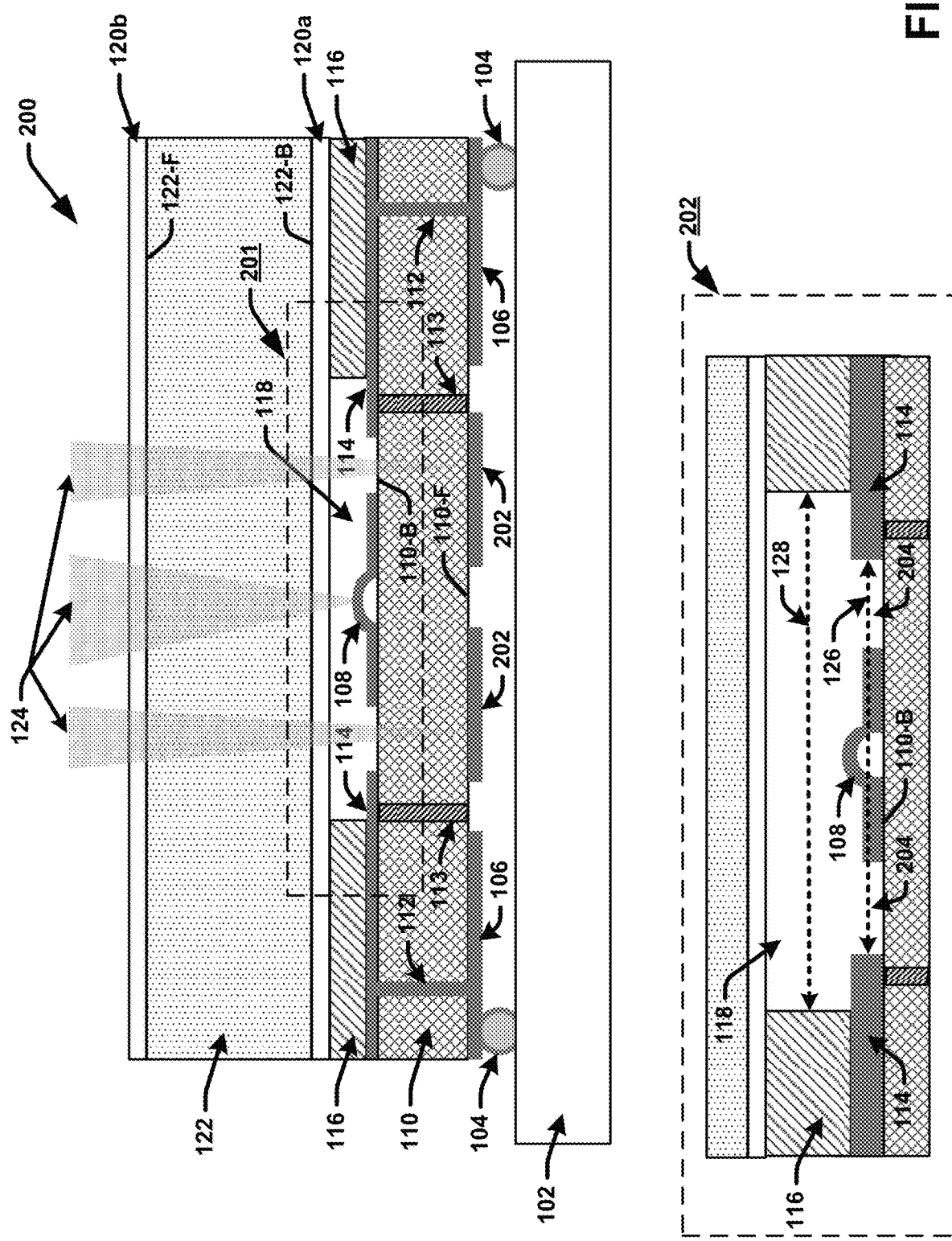
FIG. 2 presents a cross-sectional view of a layered substrate structure with aligned optical access to electrical devices formed thereon in accordance with embodiments described herein.

FIG. 2 presents a cross-sectional view of layered substrate structure 200 with aligned optical access to electrical devices formed thereon in accordance with embodiments described herein. Layered substrate structure 200 includes same or similar features and functionalities as layered substrate structure 100 with some structural variations. Repetitive description of like elements employed in respective embodiments is omitted for sake of brevity.

Layered substrate structure 200 includes electrical devices on both the front and back surfaces of the device chip that can respectively be accessed and tuned via a laser beam 124 from the front surface 122-F of the optical substrate 122 through the optical substrate 122. For example, different from layered substrate structure 100, with layered substrate structure 200, the electrical component 108 is formed directly on the back surface 110-B of the device chip on the exposed portion of the device chip 110 within the first opening 126. Layered substrate structure 200 also includes additional electrical components 202 formed on the front surface 110-F of the device chip. The type and number of the electrical components 202 can vary. For example, the electrical components 202 can include, but are not limited to: a thin film metal structure, a thin film metal structure formed with a superconducting metal, a thin film wire, an air bridge, a qubit, an electrode, a capacitor and/or a resonator.

An extracted view of a central region of the layered substrate structure 200 in dashed box 201 is shown in the bottom left corner of FIG. 2. As shown in the extracted view of dashed box 201, the electrical component 108 is positioned directly on the back surface 110-B of the device chip 110 between the metal portions of the patterned metal layer 114 within first opening 126. With this position, an optical path to the electrical component 108 is provided directly through the optical substrate 122 and the second opening 128 in the patterned bonding layer 116. In this regard, the electrical component 108 is aligned with the second opening 128. Although the electrical component 108 in this embodiment corresponds to an air bridge, it should be appreciated that the type of the electrical component 108 can vary. For example, the electrical component 108 can include, but is not limited to: a thin film metal structure, a thin film metal structure formed with a superconducting metal, a thin film wire, an air bridge, a qubit, an electrode, a capacitor and/or a resonator. The number of electrical components formed on the back-surface of the device chip 110 within the first opening 126 can also vary.

Open regions 204 are further established on opposite sides of the electrical component 108 between the electrical component 108 and the metal portions of the patterned metal layer 114. These open regions 204 provide an optical path for laser access to additional electrical components 202 formed on the front surface 110-F of the device chip. In particular, the components 202 are respectively aligned with and positioned directly below the open regions 204. As a result, the electrical components 202 can respectively be optically accessed by a laser beam 124 through optical substrate 122 (e.g., from the front surface 122-F), the second opening 128, the open regions 204 and the device substrate. The alignment marks 113 (and/or the TSVs 112) can also provide for aligning the electrical components 202 with the open regions 204 using same or similar techniques as described with reference to FIG. 1.

The size of the open regions 204 can vary. In this regard, the size of the first opening 126 and the second opening 128 can be tailored to accommodate the size of the electrical component 108 while providing enough open space on either sides of the electrical component 108 to form open regions 204 that are large enough to pass a laser beam 124 of a desired diameter therethrough.

Figure 3:
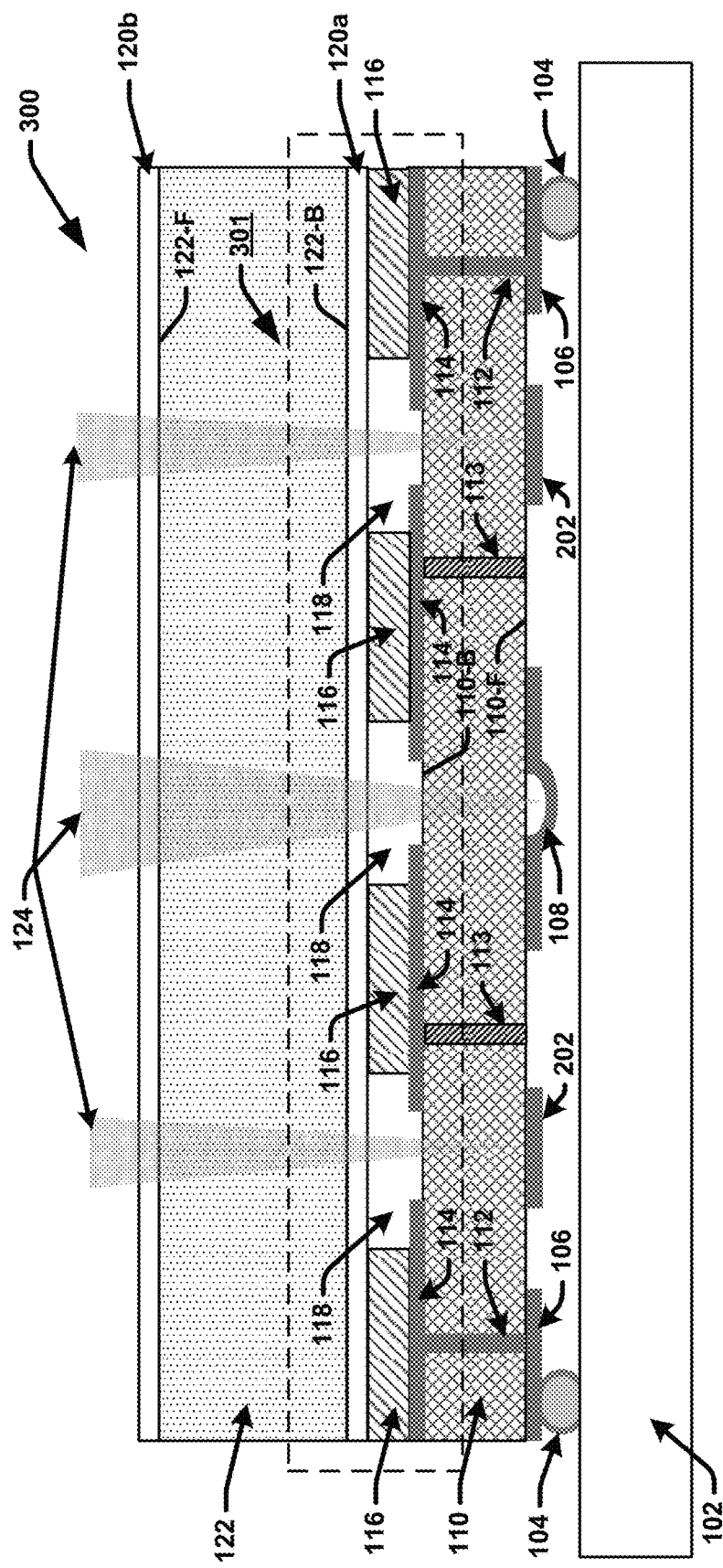
FIG. 3 presents a cross-sectional view of another layered substrate structure with aligned optical access to electrical devices formed thereon in accordance with embodiments described herein.
Figure 3:
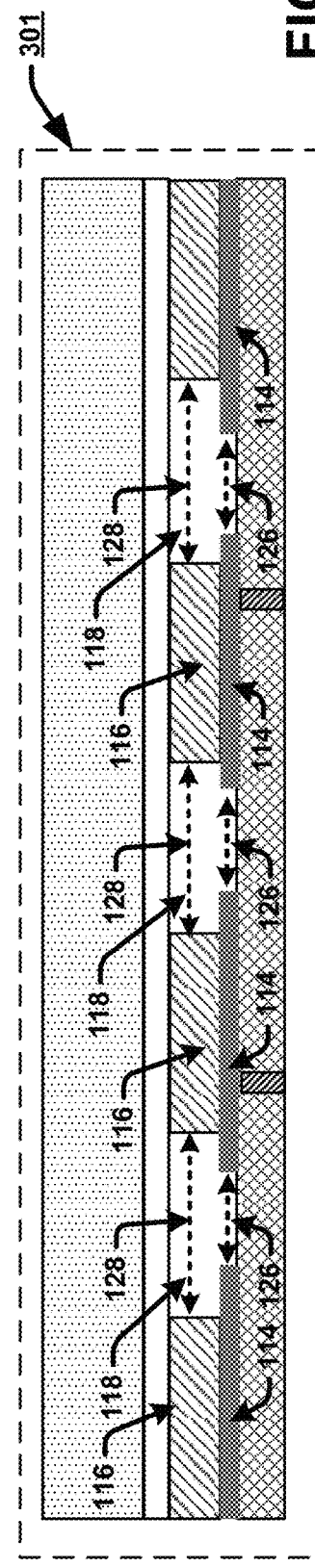

FIG. 3 presents a cross-sectional view of another layered substrate structure 300 with aligned optical access to electrical devices formed thereon in accordance with embodiments described herein. Layered substrate structure 300 includes same or similar features and functionalities as layered substrate structure 100 and layered substrate structure 200 with some structural variations. Repetitive description of like elements employed in respective embodiments is omitted for sake of brevity.

Layered substrate structure 300 differs from layered substrate structure 200 and layered substrate structure 100 with respect to the number of openings in the patterned metal layer 114 and the patterned bonding layer 116. For example, in the embodiment shown, both the patterned metal layer 114 and the patterned bonding layer 116 include three aligned openings.

An extracted view of a central region of the layered substrate structure 300 in dashed box 301 is shown in the bottom left corner of FIG. 3. As shown in the extracted view of dashed box 301, the patterned metal layer 114 includes three first openings 126 and the patterned bonding layer 116 includes three second openings 128. The respective first openings 126 are further aligned with the corresponding second openings 128. The layered substrate structure 300 also include three enclosed cavities 118. It should be appreciated that three openings and cavities are shown merely for exemplary purposes and that the number of first openings 126, second openings 128 and enclosed cavities 118 can be unlimited.

Similar to layered substrate structure 100 and layered substrate structure 200, the device chip 110 includes electrical components formed thereon that are aligned with the respective first openings 126 and the respective second openings 128 so as to provide an optical path for laser beam 124 access to the electrical components through optical substrate 122 (e.g., from the front surface 122-F), the second openings 128, the first openings 126 and the device chip 110. In the embodiment shown, these electrical components include electrical component 108 and electrical components 202 formed on the front surface 110-F of the device chip 110. The type and number of the electrical components formed on the front surface 110-F of the device chip can vary. The alignment marks 113 (and/or the TSVs 112) can also provide for aligning the electrical component 108 and the electrical components 202 with their corresponding openings in the patterned metal layer 114 and the patterned bonding layer 116, as described with reference to FIG. 1.

As described with reference to FIG. 1, in some embodiments, the device chip 110 can be bonded to the optical substrate 122 in an inert environment (e.g., in an inert gas environment such as nitrogen, argon and/or other inert gases) and/or under vacuum, resulting in the enclosed cavities 118 being devoid of and or having a very low concentration of oxygen and/or water. As a result, any metal components and structures exposed within the enclosed cavities 118 will be prevented from oxidation and/or corrosion. In embodiments, in which the device chip 110 was bonded to the optical substrate 122 in an inert environment, the enclosed cavities 118 can comprise an inert gas such as nitrogen, argon, or another inert gas.

Figure 4:
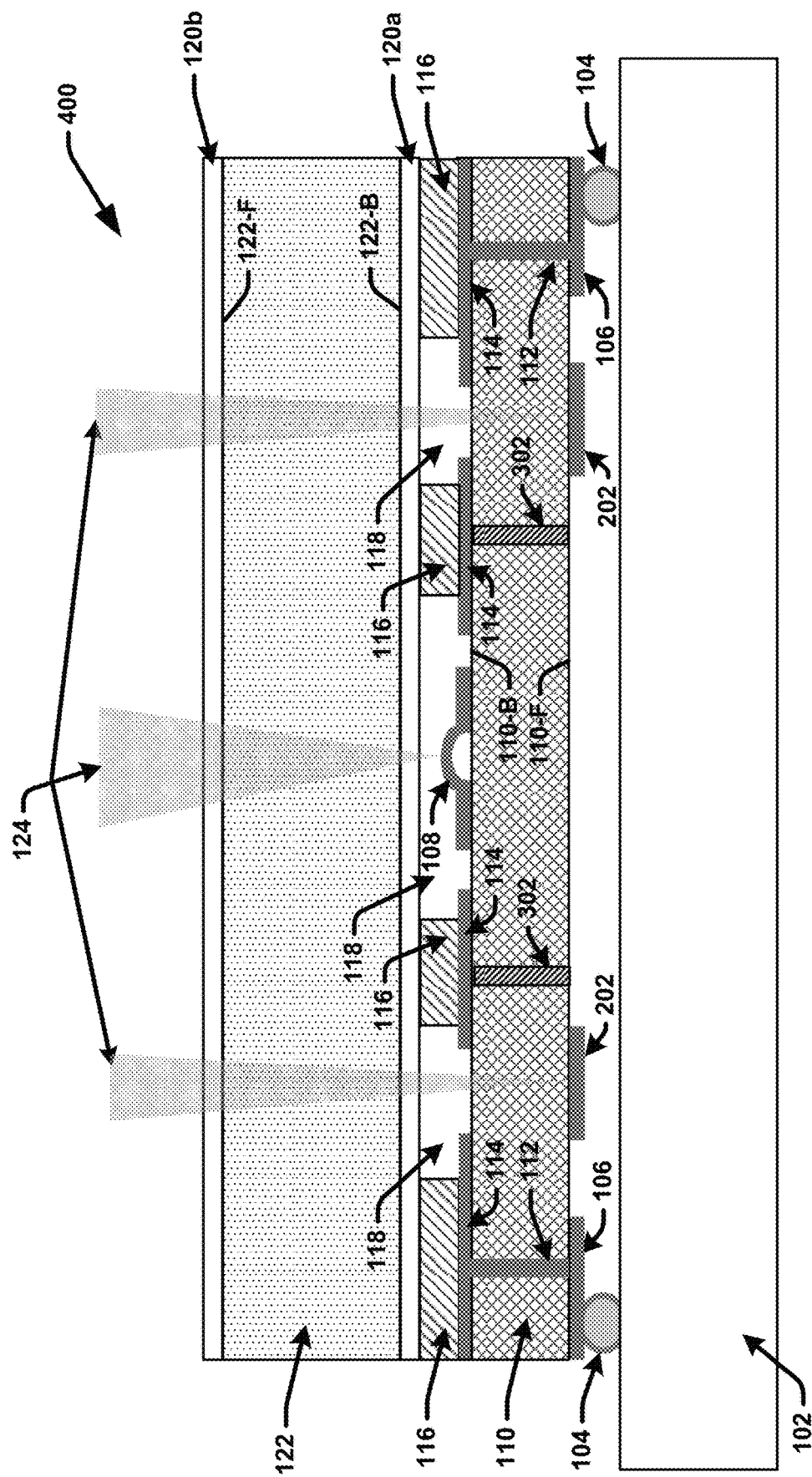
FIG. 4 presents a cross-sectional view of another layered substrate structure with aligned optical access to electrical devices formed thereon in accordance with embodiments described herein.

FIG. 4 presents a cross-sectional view of another layered substrate structure 400 with aligned optical access to electrical devices formed thereon in accordance with embodiments described herein. Layered substrate structure 400 includes same or similar features and functionalities as layered substrate structure 100, layered substrate structure 200, and layered substrate structure 300 with some structural variations. Repetitive description of like elements employed in respective embodiments is omitted for sake of brevity.

Similar to layered substrate structure 300, layered substrate structure 400 includes a plurality (e.g., three) of first openings 126 in the patterned metal layer 114 and a plurality of second openings 128 in the patterned bonding layer 116 that are aligned therewith. Layered substrate structure 400 also includes a plurality of enclosed cavities 118. Layered substrate structure 400 differs from layered substrate structure 300 with respect to the position of the electrical component 108. In this regard, the position of the electrical component 108 in layered substrate structure 400 is similar to that of layered substrate structure 200, wherein the electrical component 108 is formed on the back surface 110-B of the device chip. Similar to layered substrate structure 200, layered substrate structure 400 includes electrical devices on both the front and back surfaces of the device chip 110 that are respectively aligned with at least one second opening 128 and at least one first opening. As a result, the electrical devices (e.g., electrical components 202 and electrical component 108) can respectively be accessed and tuned via a laser beam 124 from the front surface 122-F of the optical substrate 122 through the optical substrate 122.

FIGS. 5A-5J illustrate an example method for forming a layered substrate structure with aligned optical access to an electrical device formed thereon in accordance with one or more embodiments. The fabrication method presented in FIGS. 5A-5J is exemplified in association with fabricating the layered substrate structure 100. However, it should be appreciated that the disclosed techniques can similarly be applied to form layered substrate structure 200, layered substrate structure 300, layered substrate structure 400, and similar layered substrate structures. Repetitive description of like elements employed in respective embodiments is omitted for sake of brevity.

Figure 5A:
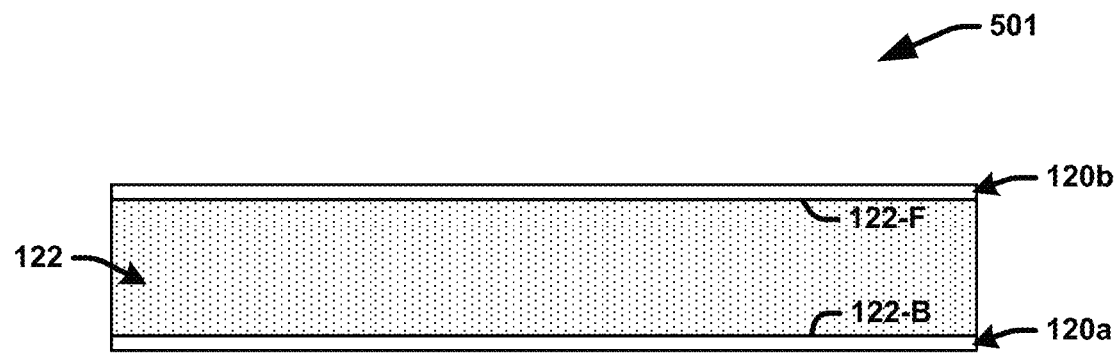
FIGS. 5A-5K illustrate an example method for forming a layered substrate structure with aligned optical access to an electrical device formed thereon in accordance with embodiments described herein.
Figure 5B:
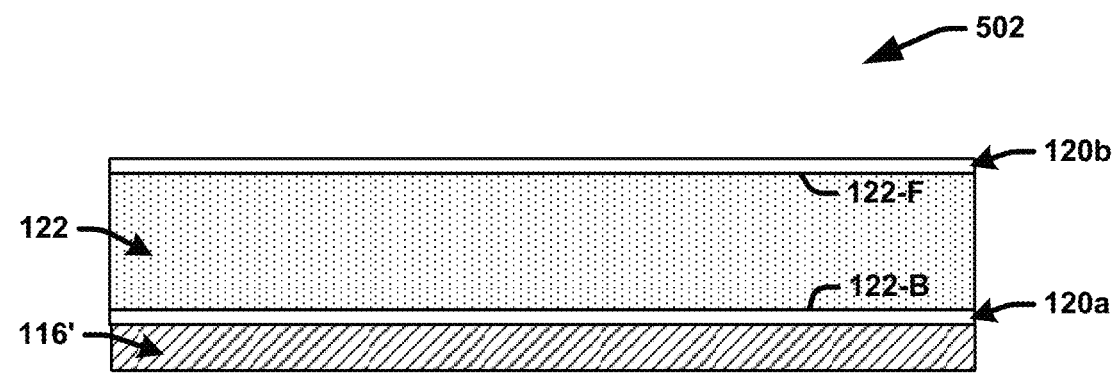
Figure 5C:
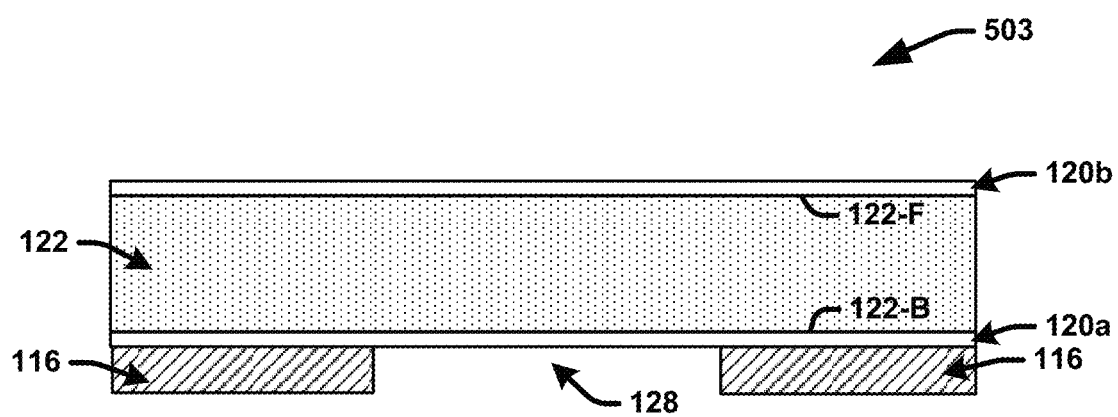

With reference to FIG. 5A, in one or more embodiments, the fabrication process can involve preparing the optical substrate 122 by polishing the front surface 122-F and the back surface 122-B thereof and depositing the antireflective coating on both surfaces, resulting in structure 501. As shown in FIG. 5B, a bonding layer 116' can then be formed on the back surface 122-B of the optical substrate 122 (e.g., on the first antireflective coating 120a), resulting in structure 502. For example, in some embodiments in which a polyimide polymer is used for the bonding layer 116', the back surface 122-B can be coated with the polyimide polymer and subsequently cured. Optionally, additional layers may be present between the first antireflective coating 120a and bonding layer 116'. Thereafter, as shown in FIG. 5C, the bonding layer 116' can be patterned (e.g., using lithography or another suitable method) to form the patterned bonding layer 116 with the second opening 128 on the back surface 122-F of the optical substrate 122, resulting in structure 503.

Figure 5D:
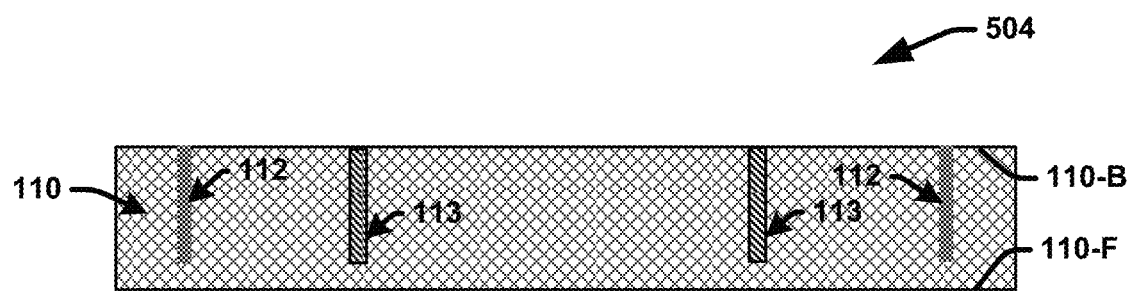
Figure 5E:
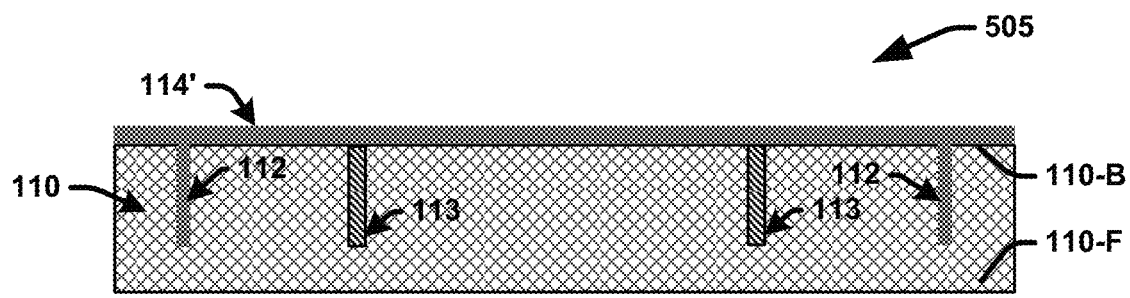

With reference to FIG. 5D, the preparation of the device chip 110 can involve forming the alignment marks 113 and the TSVs 112 through a portion of the device chip 110, resulting in structure 504. For example, in the embodiment shown, the alignment marks 113 and the TSVs are only formed partially through the device chip 110 such that they do not reach the front surface 110-F of the device chip. In other embodiments, the alignment marks 113 and the TSVs can be formed entirely through the device chip 110 such that reach both the back surface 110-B and the front surface 110-F of the device chip 110. In some embodiments, both the alignment marks 113 and the TVS 112 can be formed in the same manner and consist of the same material. For example, in some embodiments, both the alignment marks 113 and the TSVs 112 can be formed by etching (e.g., via lithography) thin lines or openings (or cuts) into the device chip 110 and thereafter filling them with a metal such as a superconducting metal or metal nitride.

Figure 5F:
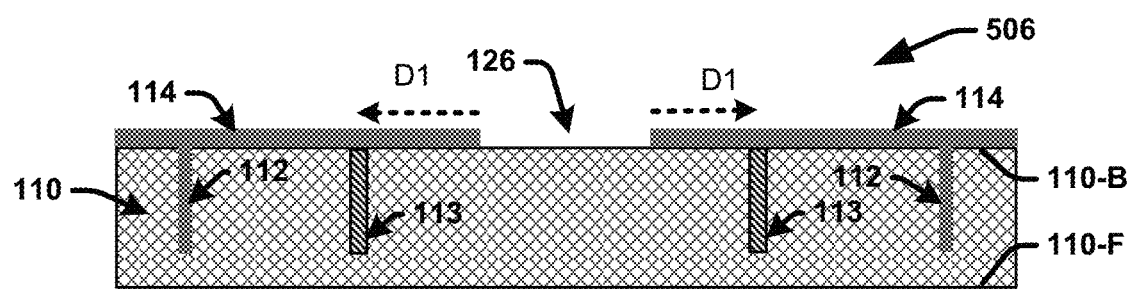

In some embodiments, after the alignment marks 113 and the TSVs 112 have been formed, a metal layer 114' can be deposited on the back surface 110-B of the device chip 110, resulting in structure 505. Thereafter, as shown in FIG. 5F, the metal layer 114' can be patterned (e.g., using lithography or another suitable method) using the alignment marks 113 (and/or the TSVs) to form the patterned metal layer 114 with the first opening 126 on the back surface 110-B of the device, resulting in structure 506. In this regard, the positions of the alignment marks 113 (and/or the TSVs 112) can be visible through the metal layer 114' due to a degree of transparency of the metal layer and/or the topography of the metal layer in combination with the formed alignment marks 113 (and/or TSVs 112). For example, in some implementations, the topography of the metal layer 114' can have bumps or indents at the positions of the alignment marks 113 (and/or TSVs) due to the structure of the alignment marks 113 (and/or the TSVs 112) and the thin material of the deposited metal layer 114. Thus, the positions of the alignment marks 113 (and/or the TSVs 112) as visible from the back surface 110-B of the device chip 110 can be used when patterning the metal layer 114' to position the first opening 126 at a defined location relative to the alignment marks 113 (and/or the TSVs 112). For example, the metal layer 114' can be etched a defined distance (D1) away from the respective alignment marks 113 as visible through the metal layer 114' on the back surface 110-F of the device chip.

Figure 5G:
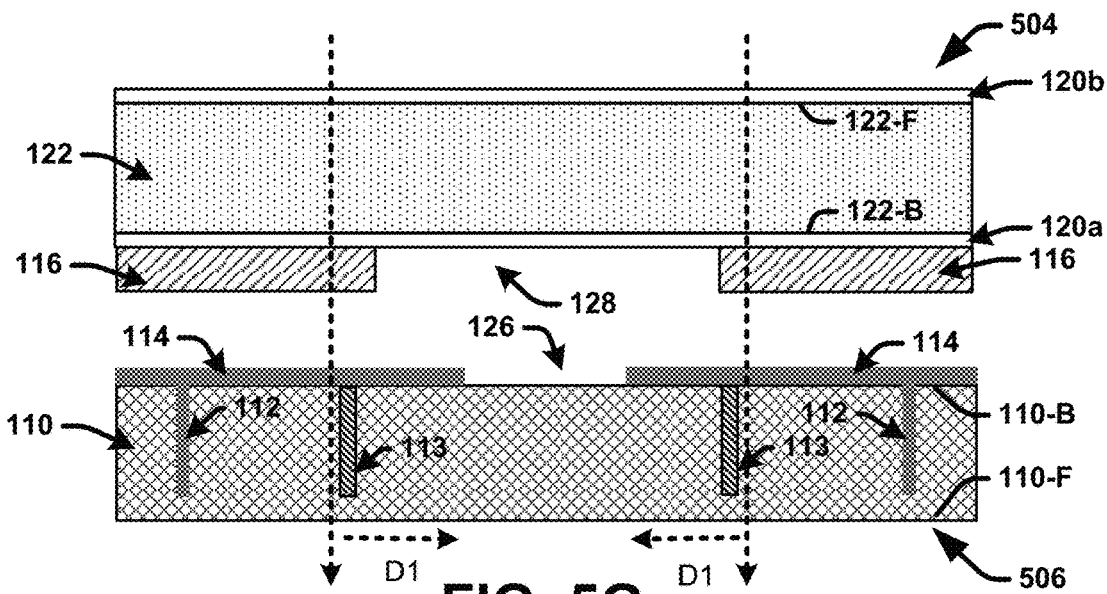
Figure 5H:
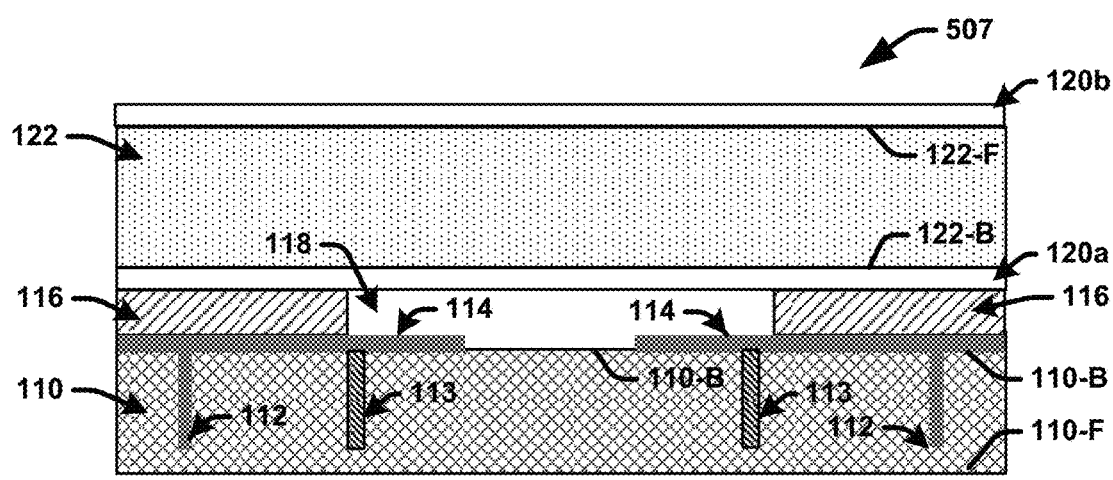

FIG. 5G demonstrates bonding structure 504 (e.g., the optical substrate 122) to structure 506 (e.g., the device chip) via the patterned bonding layer 116 and aligning the first opening 126 in the patterned metal layer 114 with the second opening 128 in the patterned bonding layer 116, resulting in structure 507 shown in FIG. 5H. In this regard, structure 504 can be bonded to structure 506 such that the bonding portions of the patterned bonding layer 116 are aligned with and bonded to the metal portions of the patterned metal layer 114. In some embodiments, a camera (e.g., an infrared (IR) camera) can be used during this bonding step to facilitate the alignment. Further, in various embodiments, this bonding step can be performed under vacuum and/or an inert environment, resulting in removal of oxygen and water particles from the resulting enclosed cavity 118. In implementations in which an inert environment is used, the resulting enclosed cavity 118 will include an inert gas (e.g., nitrogen, argon, or another inert gas).

Figure 5I:
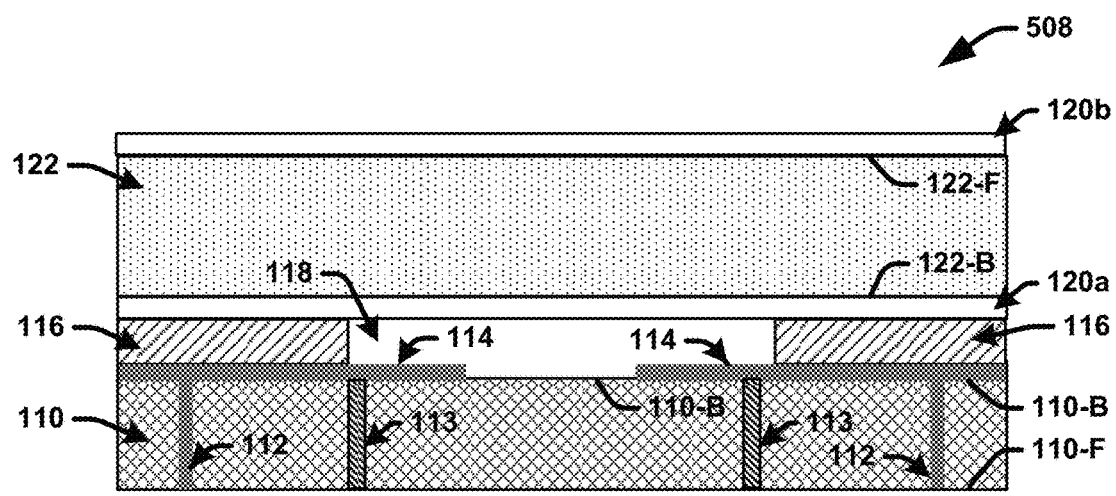

After the device chip 110 has been bonded to the optical substrate 122 (or handler), the front surface 110-F can be grinded down to a desired thickness so as to expose the alignment marks 113 and the TSVs 112 on the front surface 110-F, as shown in FIG. 5I, resulting in structure 508.

Figure 5J:
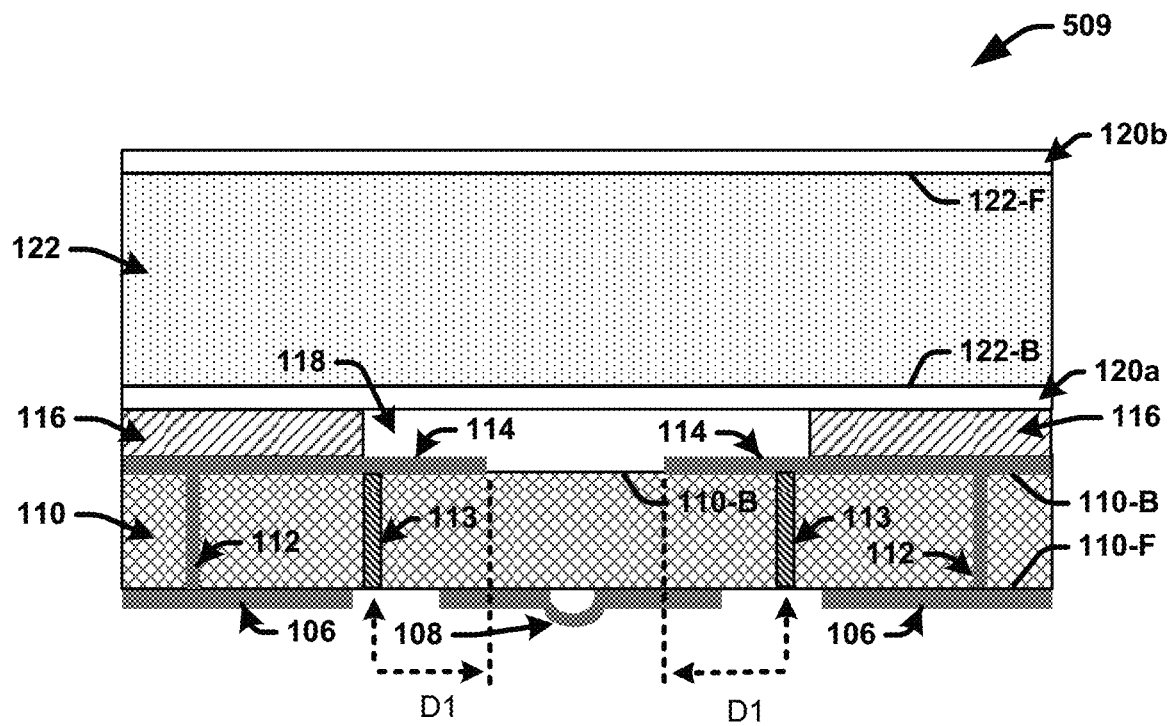

FIG. 5J demonstrates forming the electrical components (e.g., electrical component 108 and electrical components 106) on the front surface of structure 508, resulting in structure 509. At this point, the position of the first opening 126 and the second opening 128 within the structure is not visible, as these openings are entirely enclosed within the structure (e.g., within enclosed cavity 118). However, the electrical component 108 can be correctly positioned on the front surface 110-F of the device chip 110 in alignment with these openings using the alignment marks 113. In this regard, because the position of the first opening 126 is known to be a defined distance D1 between the respective alignment marks 113, the electrical component 108 can be formed between the alignment marks using this distance reference as a guide to ensure the electrical component 108 is positioned in alignment with the first opening 126.

Figure 5K:
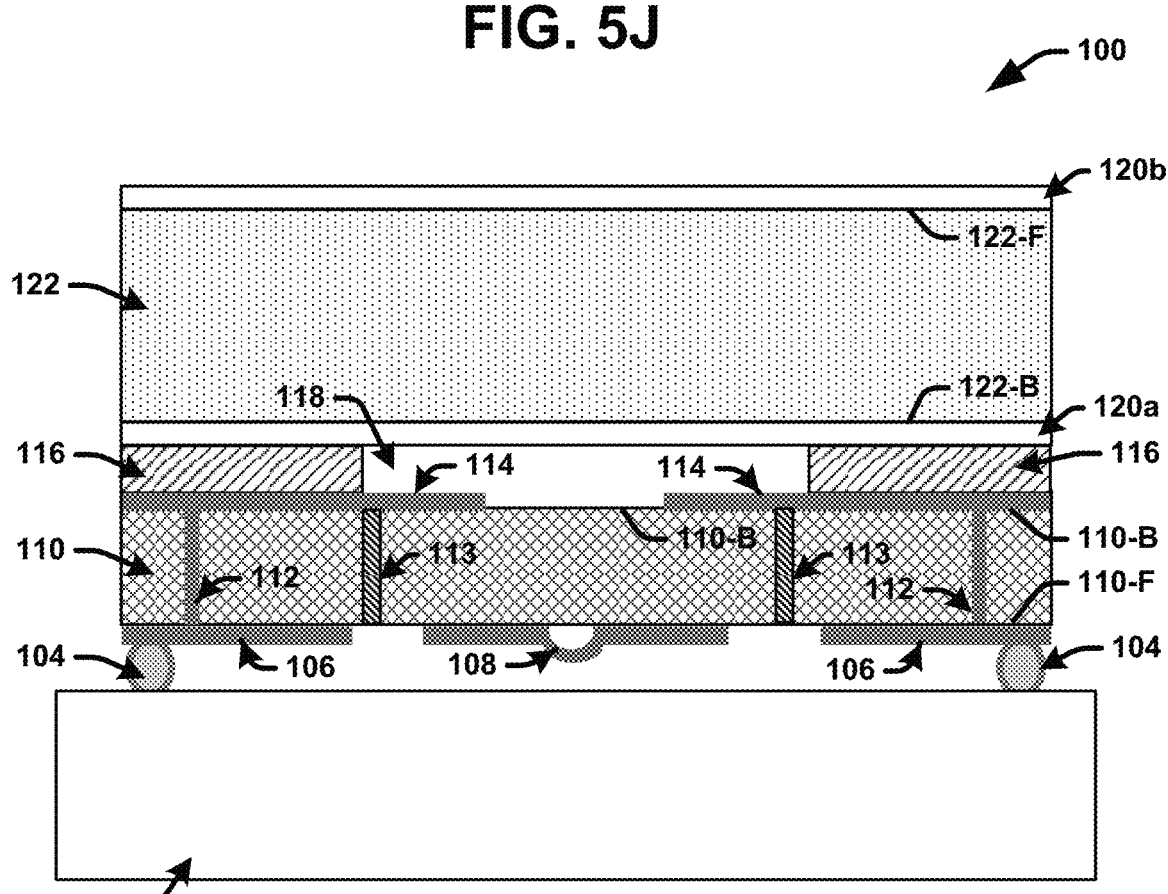

FIG. 5K demonstrates bonding structure 508 to the silicon interposer 102 via one or more solder bonds 104, resulting in layered substrate structure 100.

FIGS. 6A-6D illustrate another example method for forming a layered substrate structure with aligned optical access to an electrical device formed thereon. The fabrication method presented in FIGS. 6A-6D is exemplified in association with fabricating the layered substrate structure 100. However, it should be appreciated that the disclosed techniques can similarly be applied to form layered substrate structure 200, layered substrate structure 300, layered substrate structure 400, and similar layered substrate structures. Repetitive description of like elements employed in respective embodiments is omitted for sake of brevity.

Figure 6A:
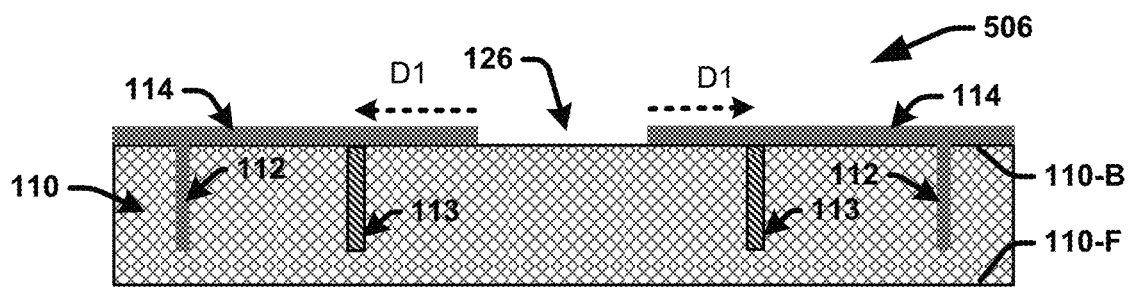
FIGS. 6A-6D illustrate another example method for forming a layered substrate structure with aligned optical access to an electrical device formed thereon in accordance with embodiments described herein.
Figure 6B:
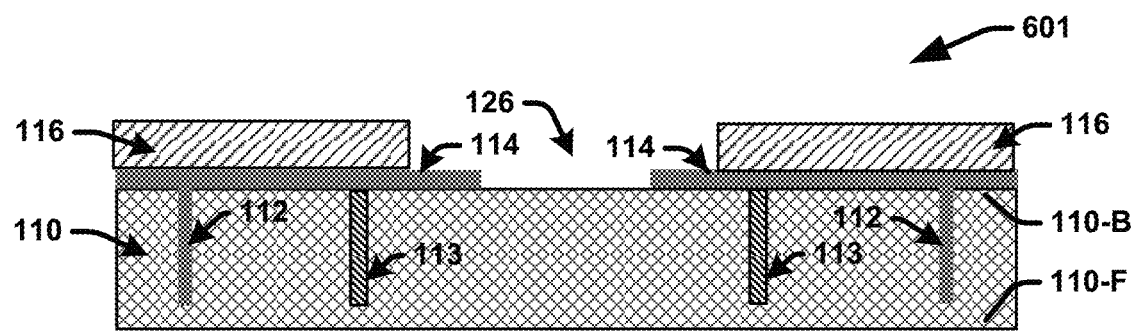
Figure 6C:
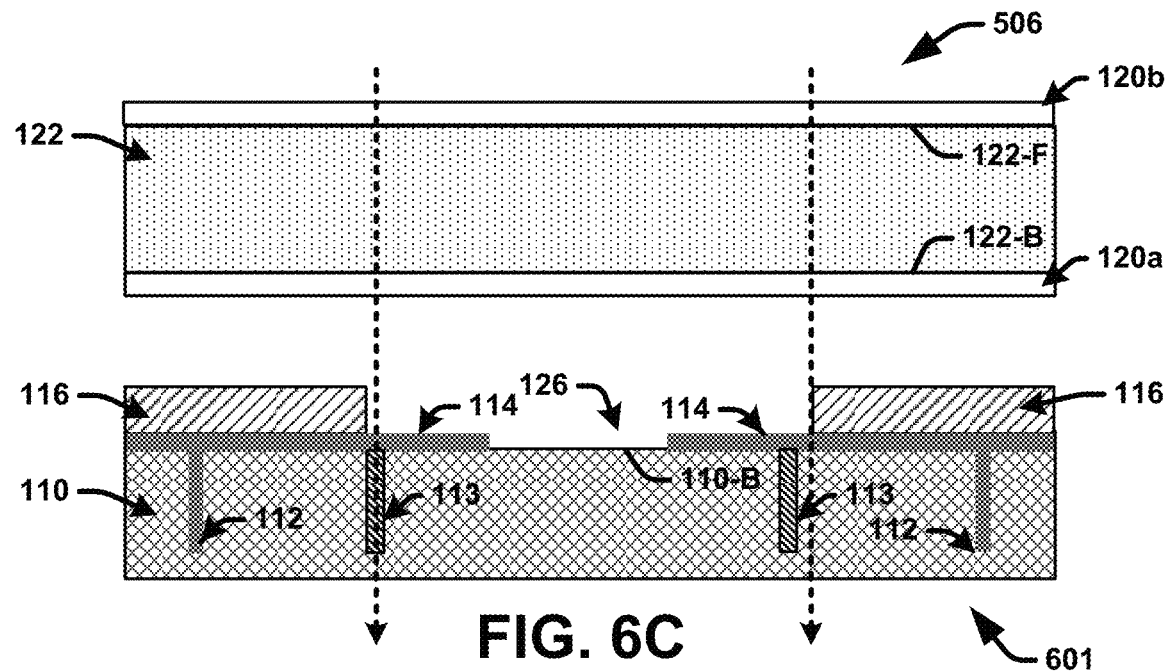
Figure 6D:
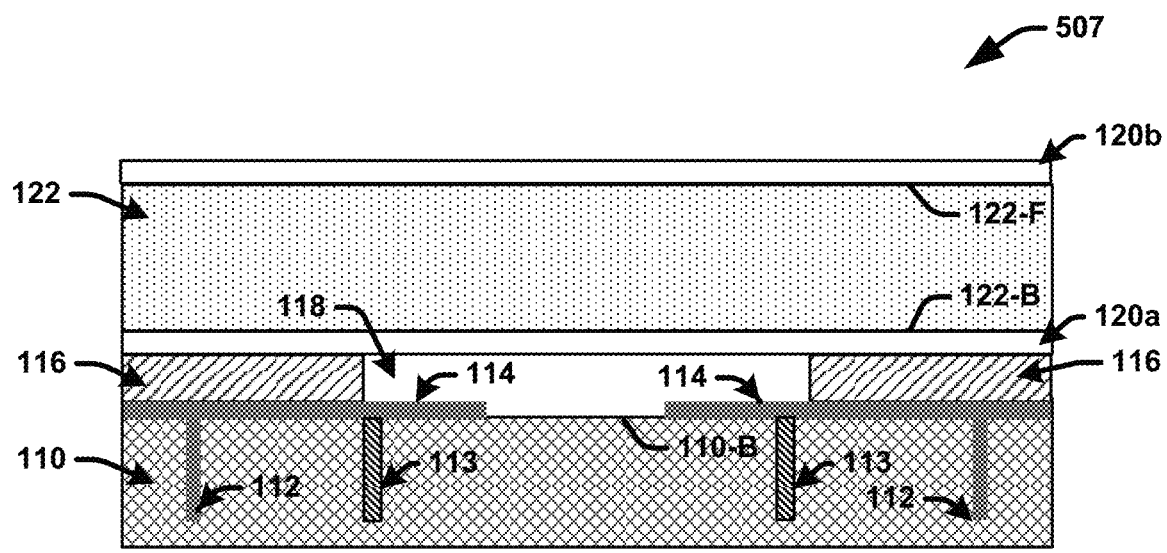

In accordance with the fabrication method described with reference to FIGS. 5A-5K, the patterned bonding layer 116 was formed on the optical substrate 122. In another embodiment, the patterned bonding layer 116 can be formed on the patterned metal layer 114. In this regard, FIG. 6A presents structure 506, which can be formed using the techniques described with reference to FIGS. 5D-5F. With this embodiment, as shown in FIG. 5B, the patterned bonding layer 116 can be formed directly on the metal portions of the patterned metal layer 114, resulting in structure 601. Thereafter, as shown in FIG. 6C, structure 601 can be bonded to structure 506 via the patterned bonding layer 116, resulting in generation of structure 507 shown again in FIG. 6D. Structure 507 can further be processed in accordance with the techniques described with reference to FIGS. 5I and 5K.

Figure 7:
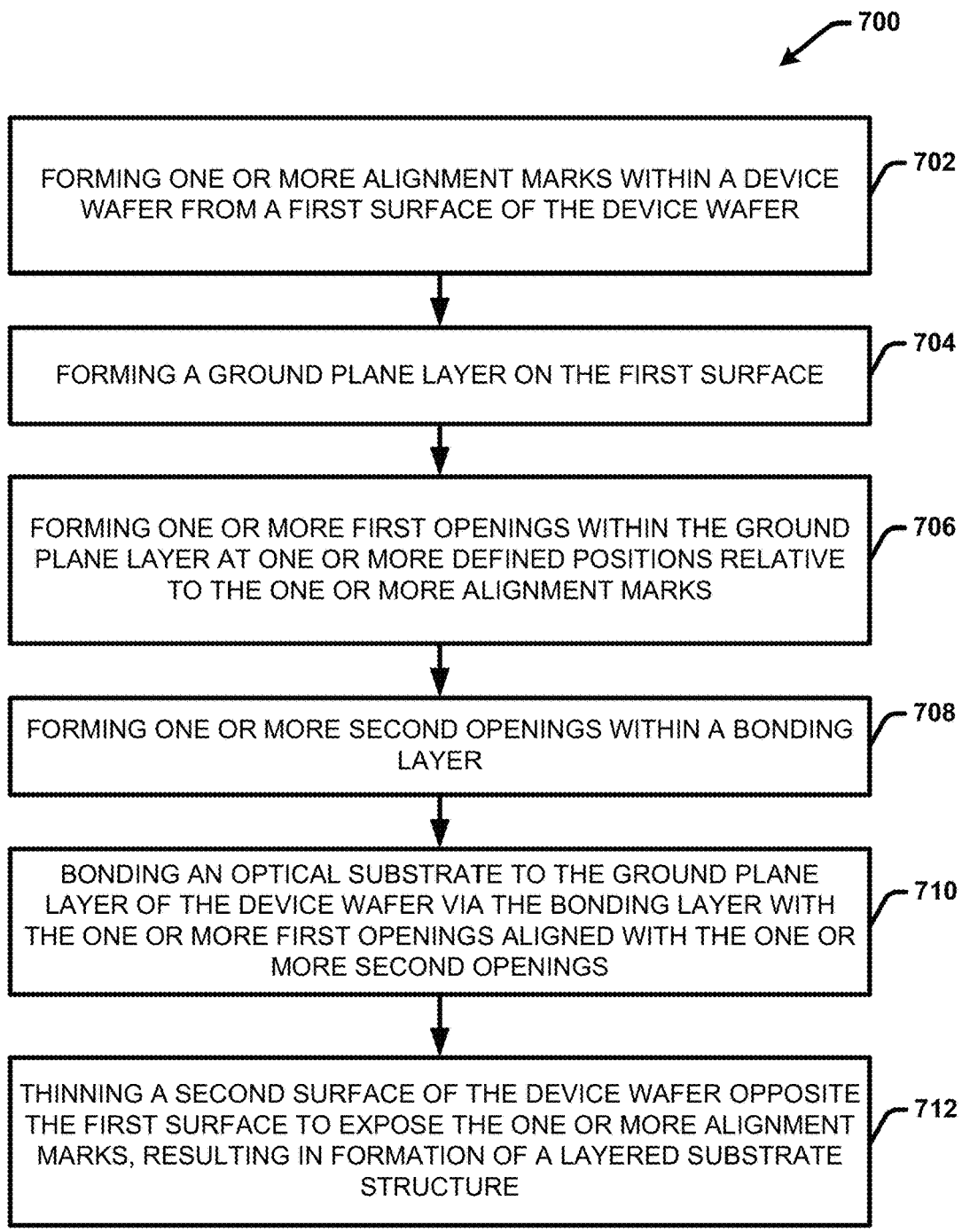
FIG. 7 presents a high-level flow diagram of an example method for forming a layered substrate structure with aligned optical access to electrical devices formed thereon in accordance with one or more embodiments described herein.

FIG. 7 presents a high-level flow diagram of an example method 700 for forming a layered substrate structure with aligned optical access to electrical devices formed thereon in accordance with one or more embodiments described herein. In various embodiments, method 700 provides an example method for forming layered substrate structure 100, layered substrate structure 200, layered substrate structure 300, and/or layered substrate structure 400. Repetitive description of like elements employed in respective embodiments is omitted for sake of brevity.

Method 700 can include, at 702, forming one or more alignment marks (e.g., alignment marks 113 and/or TSVs 112) through a device wafer (e.g., device chip 110) from a first surface of the device wafer (e.g., back surface 110-B). Method 700 further includes forming a ground plane layer (e.g., metal layer 114') on the first surface at 704, and at 706, forming one or more first openings (e.g., one or more first openings 126) within the ground plane layer at one or more defined positions relative to the one or more alignment marks (e.g., resulting in formation of patterned metal layer 114). Method 700 further includes, at 708, forming one or more second openings (e.g., one or more second openings 128) within a bonding layer (e.g., resulting in formation of patterned bonding layer 116). In some embodiments, forming the one or more second openings comprises patterning the bonding layer as formed on a surface of the optical substrate. Additionally, or alternatively, forming the one or more second openings comprises depositing the bonding layer on one or more portions of the ground plane layer excluding the one or more first openings.

Method 700 further includes, at 710, bonding the optical substrate to the ground plane layer of the device wafer via the bonding layer with the one or more first openings aligned with the one or more second openings. Method 700 further includes, at 712 thinning a second surface (e.g., the front surface 110-F) of the device wafer opposite the first surface to expose the one or more alignment marks, resulting in formation of a layered substrate structure (e.g., layered substrate structure 100, layered substrate structure 200, layered substrate structure 300, and/or layered substrate structure 400).

Figure 8:
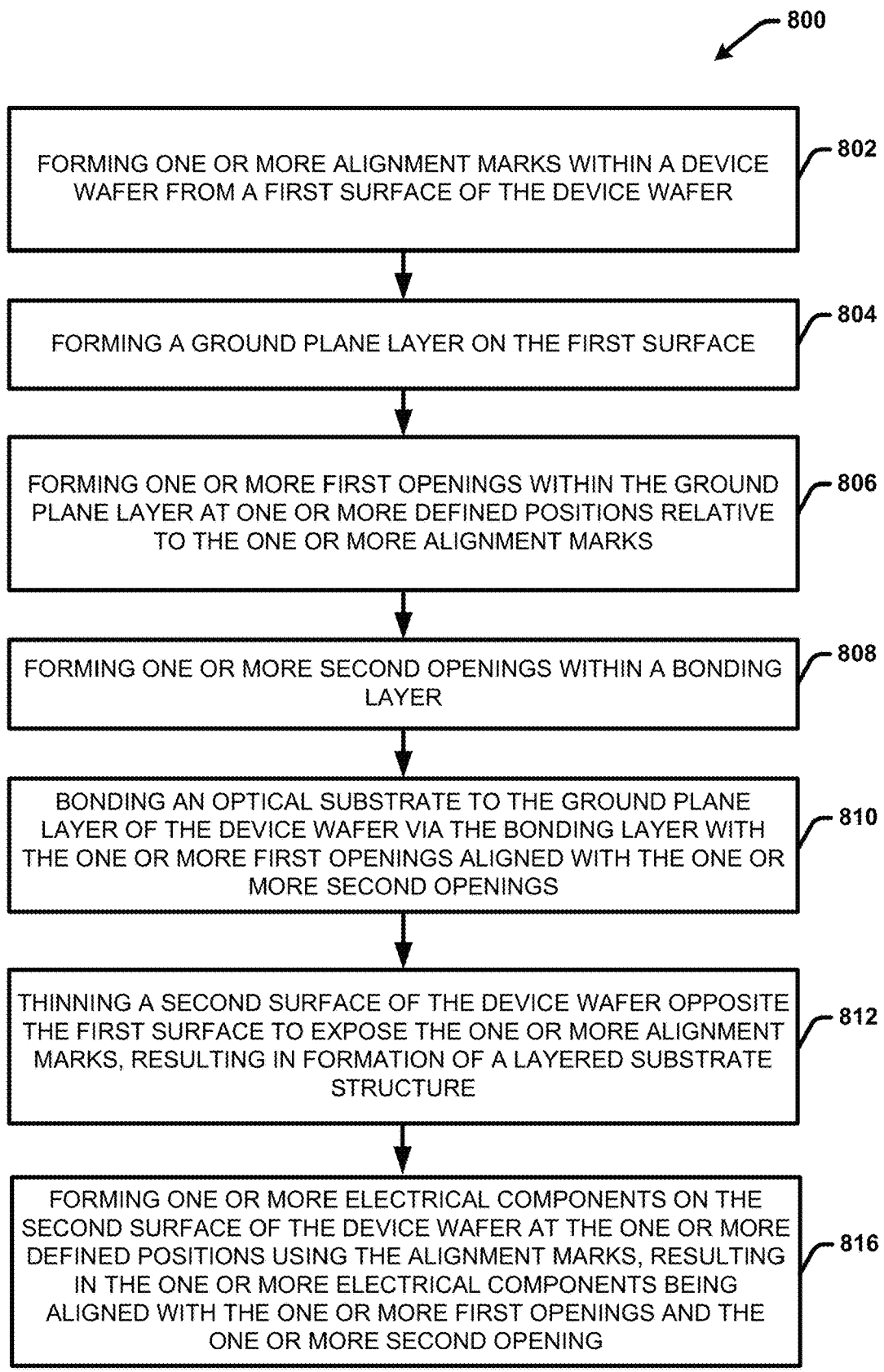
FIG. 8 presents a high-level flow diagram of another example method for forming a layered substrate structure with aligned optical access to electrical devices formed thereon in accordance with one or more embodiments described herein.

FIG. 8 presents a high-level flow diagram of another example method 800 for forming a layered substrate structure with aligned optical access to electrical devices formed thereon in accordance with one or more embodiments described herein. In various embodiments, method 800 provides an example method for forming layered substrate structure 100, layered substrate structure 200, layered substrate structure 300, and/or layered substrate structure 400. Repetitive description of like elements employed in respective embodiments is omitted for sake of brevity.

Method 800 can include, at 802, forming one or more alignment marks (e.g., alignment marks 113 and/or TSVs 112) through a device wafer (e.g., device chip 110) from a first surface of the device wafer (e.g., back surface 110-B). Method 800 further includes forming a ground plane layer (e.g., metal layer 114') on the first surface at 804, and at 806, forming one or more first openings (e.g., one or more first openings 126) within the ground plane layer at one or more defined positions relative to the one or more alignment marks (e.g., resulting in formation of patterned metal layer 114). Method 800 further includes, at 808, forming one or more second openings (e.g., one or more second openings 128) within a bonding layer (e.g., resulting in formation of patterned bonding layer 116). Method 800 further includes, at 810, bonding the optical substrate to the ground plane layer of the device wafer via the bonding layer with the one or more first openings aligned with the one or more second openings. Method 800 further includes, at 812 thinning a second surface (e.g., the front surface 110-F) of the device wafer opposite the first surface to expose the one or more alignment marks, resulting in formation of a layered substrate structure (e.g., layered substrate structure 100, layered substrate structure 200, layered substrate structure 300, and/or layered substrate structure 400).

Method 800 further comprises, at 812 forming one or more electrical components (e.g., electrical components 106, electrical component 108, electrical components 202, and the like) on the second surface of the device wafer (e.g., front surface 110-F) at the one or more defined positions using the alignment marks, resulting in the one or more electrical components being aligned with the one or more first openings and the one or more second openings. In some implementations, the method can further comprise forming one or more enclosed cavities (e.g., one or more enclosed cavities 118) between the device wafer and the optical substrate at the one or more second openings as a result of the bonding, and wherein the bonding comprises bonding the optical substrate to the device wafer under a vacuum or inert environment, resulting in removal of oxygen and water from the one or more enclosed cavities.

Figure 9:
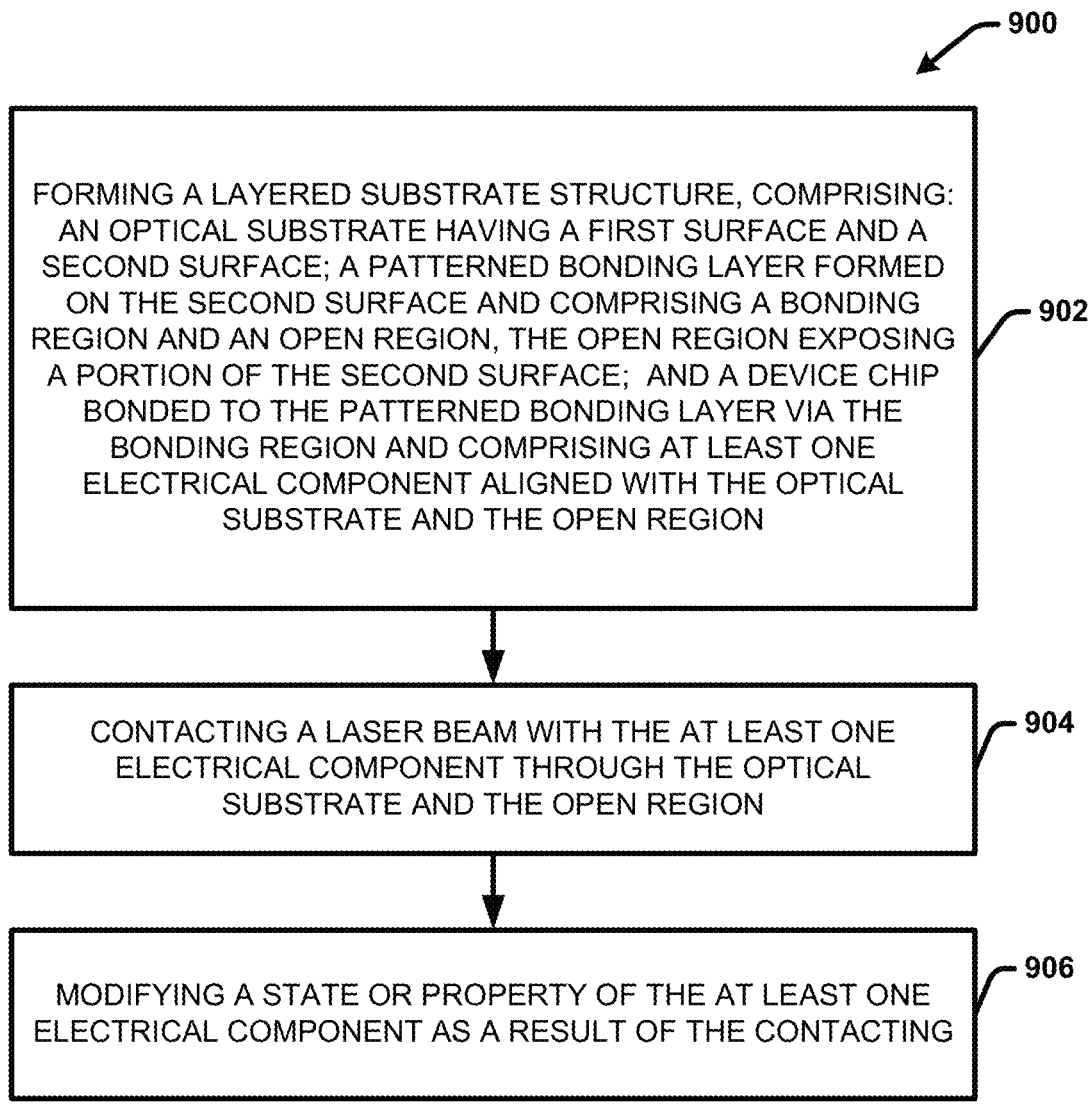
FIG. 9 presents a high-level flow diagram of an example method for tuning an electrical device formed on a layered substrate structure in accordance with one or more embodiments described herein.

FIG. 9 presents a high-level flow diagram of an example method 900 for tuning an electrical device formed on a layered substrate structure in accordance with one or more embodiments described herein. Repetitive description of like elements employed in respective embodiments is omitted for sake of brevity.

In accordance with method 900, at 902 a layered substrate structure is formed (e.g., layered substrate structure 100, layered substrate structure 200, layered substrate structure 300, and/or layered substrate structure 400, wherein the comprises an optical substrate having a first surface and a second surface, a patterned bonding layer formed on the second surface and comprising a bonding region and an open region, the open region exposing a portion of the second surface, and a device chip bonded to the patterned bonding layer via the bonding region and comprising at least one electrical component aligned with the optical substrate and the open region (e.g., electrical components 106, electrical component 108, electrical components 202, and the like). Method 900 further comprises, at 904 contacting a laser beam (e.g., laser beam 124) with the at least one electrical component through the optical substrate and the open region, and at 906, modifying a state or property of the at least one electrical component as a result of the contacting. For example, in embodiments in which the at least one electrical component comprises an air-bridge, the laser beam can be used to open and close the air-bridge. In another example, in which the at least one electrical component comprises a qubit, the laser beam can be used to change the resonant frequency of the qubit. In other embodiments, the state or property of an electrical device such as a transistor, resistor, diode or the like can be changed using the laser beam. With this method the laser beam (e.g., laser beam 124) can be operating at any wavelength that provides for transmission of light through the optical substrate 122. For example, the laser wavelength can be selected from the wavelength range of 1000 to 0.2 microns, with the range 0.5 to 3 microns being a preferred range. For example, the wavelength of 1.5 microns can be used in various embodiments.

What has been described above includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described in this disclosure for illustrative purposes, various modifications are possible that are considered within the scope of such embodiments and examples, as those skilled in the relevant art can recognize.

In this regard, with respect to any figure or numerical range for a given characteristic, a figure or a parameter from one range may be combined with another figure or a parameter from a different range for the same characteristic to generate a numerical range. Other than in the operating examples, or where otherwise indicated, all numbers, values and/or expressions referring to quantities of ingredients, reaction conditions, etc., used in the specification and claims are to be understood as modified in all instances by the term "about."

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Moreover, the words "example" or "exemplary" are used in this disclosure to mean serving as an example, instance, or illustration. Any aspect or design described in this disclosure as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A layered substrate structure, comprising:
    an optical substrate having a first surface and a second surface;
    a patterned bonding layer formed on the second surface and comprising a bonding region and a first open region, the first open region exposing a portion of the second surface;
    a device chip bonded to the patterned bonding layer via the bonding region and comprising at least one electrical component aligned with the optical substrate and the first open region; and
    a ground plane layer directly formed on a bonded surface of the device chip via which the device chip is bonded to the patterned bonding layer, the ground plane layer comprising a second open region smaller than the first open region,
    wherein the device chip comprises a front surface opposite the bonded surface, and wherein the at least one electrical component is formed on the front surface, and
    wherein the electrical component is formed within a region of the front surface that overlaps the second open region in a direction different from the direction of the front surface and wherein the device chip has a qubit provided on the deivce chip.

2. The layered substrate structure of claim 1, further comprising:
    one or more enclosed cavities formed between the optical substrate and the device chip within the open region.

3. The layered substrate structure of claim 1, further comprising:
    an optical path through the optical substrate and the open region that provides for at least 50% light transmission to the at least one electrical component at a wavelength between 0.5 to 3.0 micrometers.

4. The layered substrate structure of claim 1, wherein the bonded surface comprises a patterned metal layer formed thereon comprising one or more openings aligned with the open region.

5. The layered substrate structure of claim 4, wherein the patterned metal layer comprises a superconducting metal material.

6. The layered substrate structure of claim 1, further comprising:
    one or more alignment marks formed on the device chip at one or more defined locations and align with the at least one electrical component with the open region.

7. The layered substrate structure of claim 1, wherein the least one electrical component is selected from a group consisting of: a thin film metal structure, a thin film wire, an air bridge, a qubit, an electrode, a capacitor and a resonator.

8. The layered substrate structure of claim 1, wherein the optical substrate comprises an antireflective coating formed on the first surface and the second surface.

9. The layered substrate structure of claim 1, wherein the optical substrate comprises a material selected from the group consisting of: sapphire, quartz, and doped silicon with a doping concentration less than about 1.E14 dopant atoms per cubic centimeter ($cm^{-3}$).

10. The layered substrate structure of claim 1, wherein the patterned bonding layer comprises a bonding material selected from a group consisting of: polyimide polymer, indium, indium nitride, gold, gold nitride, platinum, platinum nitride, titanium, titanium nitride, tantalum, tantalum nitride, chromium, chromium nitride, tungsten, tungsten nitride, silver, silver nitride, copper, aluminum, aluminum oxide and tin.

11. A layered substrate structure, comprising:
    a device wafer comprising a ground plane layer formed on a first surface of the device wafer, the ground plane layer comprising one or more first openings aligned with at least one electrical component of the device wafer; and
    an optical substrate bound to the first surface via a patterned bonding layer comprising at least one second opening aligned with at least one of the one or more first openings, wherein the device wafer comprises a front surface opposite the first surface, wherein the electrical component is formed on the front surface, and wherein the device wafer has a qubit provided on the device wafer.

12. The layered substrate structure of claim 11, wherein the at least one electrical component is formed on a second surface of the device wafer opposite the first surface, and wherein the device wafer comprises one or more alignment marks that align the at least one electrical component with the one or more first openings.

\* \* \* \* \*